(12) United States Patent
Miwa

(10) Patent No.: US 7,672,163 B2
(45) Date of Patent: Mar. 2, 2010

(54) CONTROL GATE LINE ARCHITECTURE

(75) Inventor: Toru Miwa, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 149 days.

(21) Appl. No.: 12/060,746

(22) Filed: Apr. 1, 2008

(65) Prior Publication Data

US 2009/0073767 A1 Mar. 19, 2009

Related U.S. Application Data

(60) Provisional application No. 60/972,570, filed on Sep. 14, 2007.

(51) Int. Cl.
*G11C 16/04* (2006.01)
(52) U.S. Cl. .................... 365/185.05; 365/185.17; 365/185.23
(58) Field of Classification Search ............ 365/185.05, 365/185.17, 185.23, 185.33, 189.07, 230.06
See application file for complete search history.

(56) References Cited

U.S. PATENT DOCUMENTS

| | | | |
|---|---|---|---|
| 5,765,002 A * | 6/1998 | Garner et al. ............ | 713/300 |
| 5,986,920 A * | 11/1999 | Tada ..................... | 365/145 |
| 6,587,381 B2 | 7/2003 | Kanai | |
| 6,675,293 B1 * | 1/2004 | Beebe et al. ............. | 713/1 |
| 6,859,397 B2 | 2/2005 | Lutze | |
| 7,117,377 B2 * | 10/2006 | Hagiwara et al. ......... | 713/300 |
| 7,120,063 B1 | 10/2006 | Liu | |
| 7,170,784 B2 | 1/2007 | Cernea | |
| 7,196,946 B2 | 3/2007 | Chen | |
| 7,209,406 B2 | 4/2007 | Chen | |
| 7,283,405 B2 * | 10/2007 | Yamanaka et al. ..... | 365/189.05 |
| 2003/0214842 A1 | 11/2003 | Jeong | |
| 2004/0090825 A1 | 5/2004 | Nam | |
| 2006/0180850 A1 | 8/2006 | Brazzelli | |
| 2007/0008806 A1 | 1/2007 | Kim | |
| 2007/0141780 A1 | 6/2007 | Higashitani | |
| 2007/0206426 A1 | 9/2007 | Mokhlesi | |
| 2008/0036095 A1 | 2/2008 | Suzuki | |

OTHER PUBLICATIONS

International Search Report dated Nov. 24, 2008, PCT Appl. PCT/US2008/074635.
Written Opinion of the International Searching Authority dated Nov. 24, 2008, PCT Appl. PCT/US2008/074635.

* cited by examiner

*Primary Examiner*—Gene N. Auduong
(74) *Attorney, Agent, or Firm*—Vierra Magen Marcus & DeNiro LLP

(57) ABSTRACT

A non-volatile storage system that includes less word line drivers than word lines by having a limited set of individually controllable drivers for a subset of unselected word lines requiring word line by word line control, and have the remaining word lines connected to a common source.

41 Claims, 20 Drawing Sheets

Fig 6
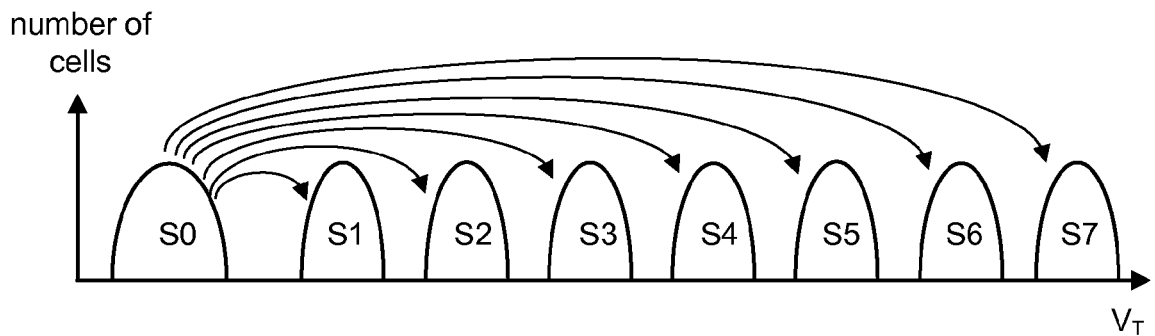
Fig. 10
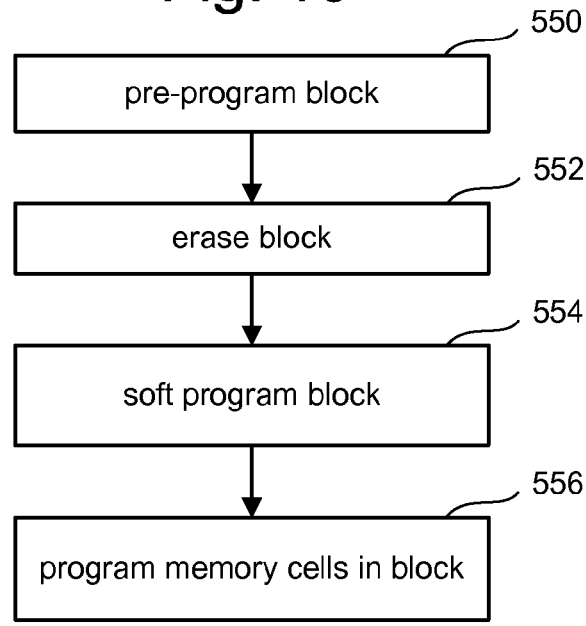
Fig 8
|  | First Page | Second Page | Third Page |
|---|---|---|---|
| WL0 | 1 | 3 | 6 |
| WL1 | 2 | 5 | 9 |
| WL2 | 4 | 8 | 11 |
| WL3 | 7 | 10 | 12 |

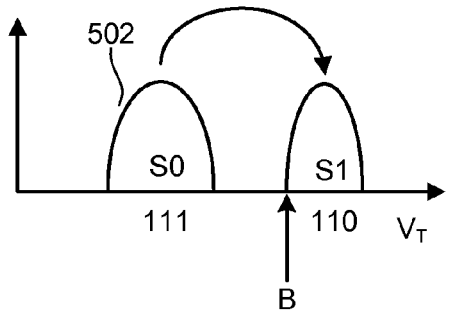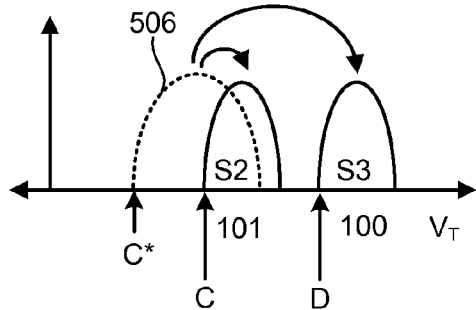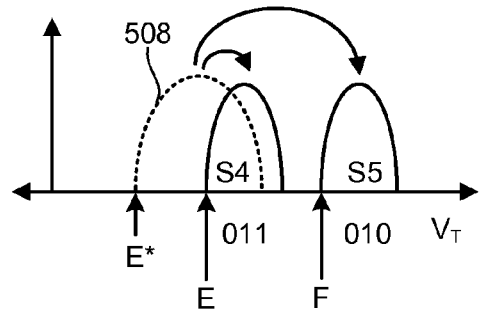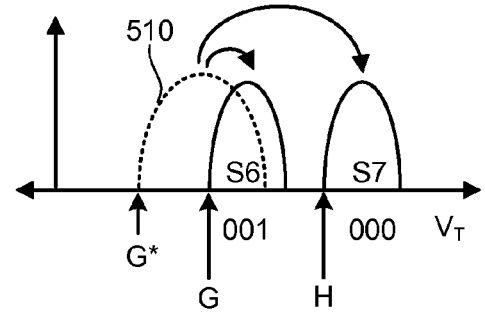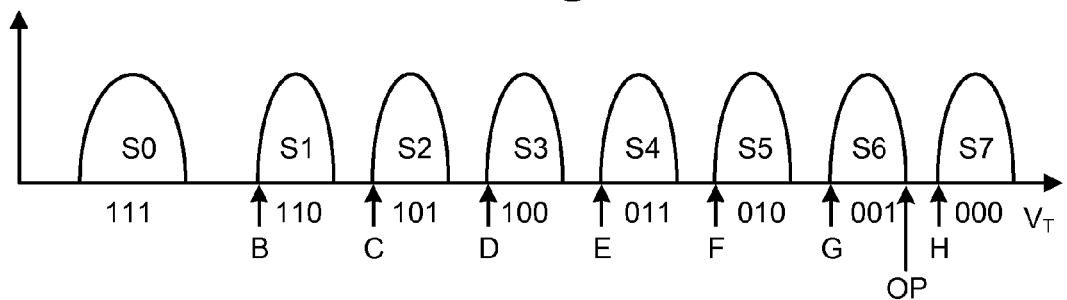

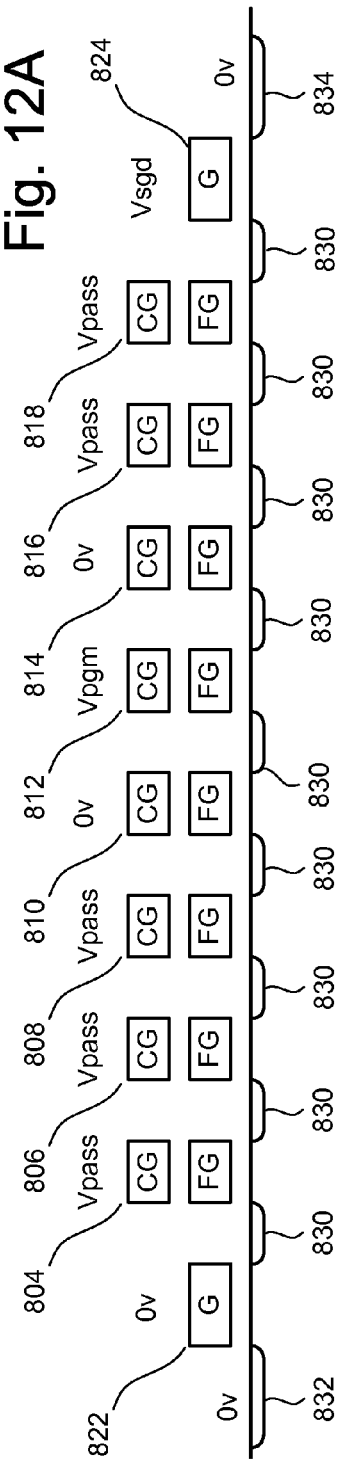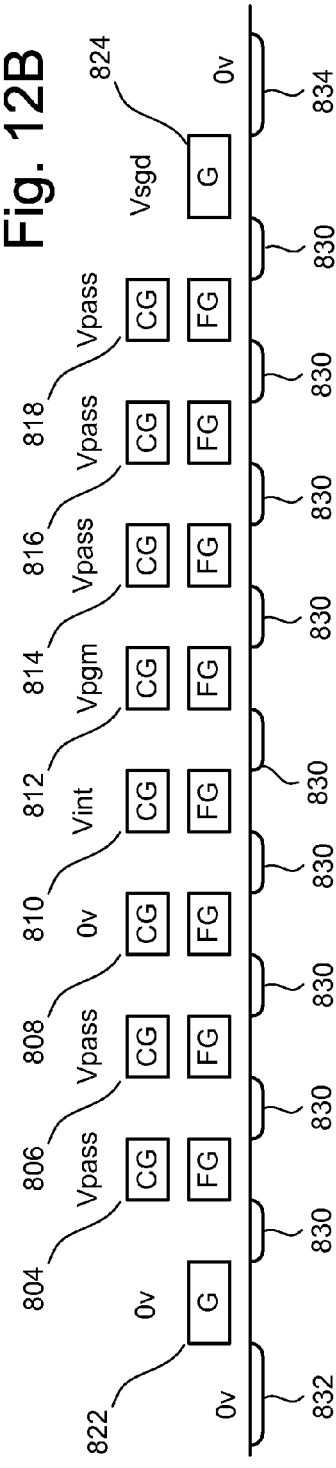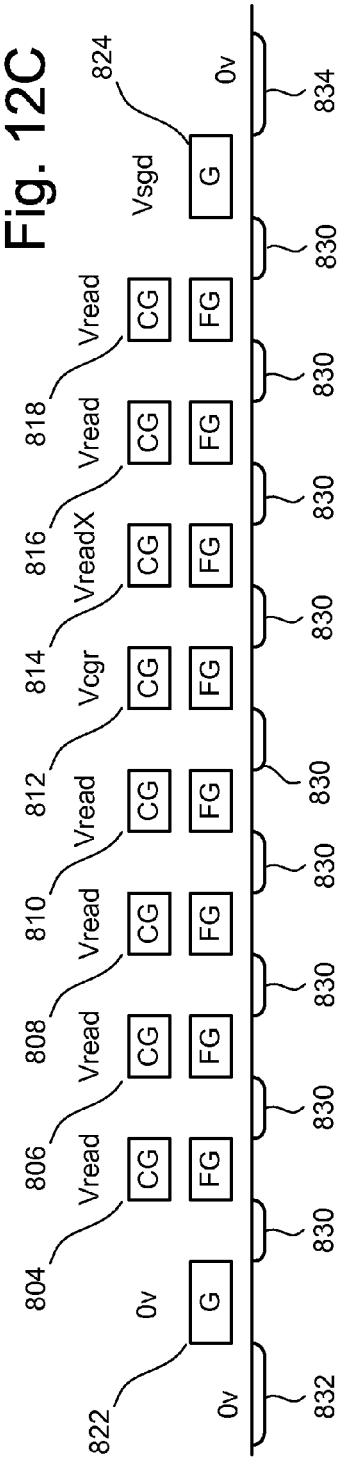

CONTROL GATE LINE ARCHITECTURE

BACKGROUND

1. Field

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate. Thus, a memory cell (which can include one or more transistors) can be programmed and/or erased by changing the level of charge on a floating gate in order to change the threshold voltage.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," both of which are incorporated herein by reference in their entirety. In many devices, the program voltage applied to the control gate during the program operation is applied as a series of pulses in which the magnitude of the pulses is increased by a predetermined step size for each successive pulse.

Each memory cell can store data (analog or digital). When storing one bit of digital data (referred to as a binary memory cell), possible threshold voltages of the memory cell are divided into two ranges which are assigned logical data "1" and "0." In one example, the threshold voltage is negative after the memory cell is erased, and defined as logic "1." After programming, the threshold voltage is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as a multi-state memory cell). In the case of storing multiple levels of data, the range of possible threshold voltages is divided into the number of levels of data. For example, if four levels of information is stored, there will be four threshold voltage ranges assigned to the data values "11", "10", "01", and "00." In one example, the threshold voltage after an erase operation is negative and defined as "11." Positive threshold voltages are used for the states of "10", "01", and "00." If eight levels of information (or states) are stored in each memory cell (e.g. for three bits of data), there will be eight threshold voltage ranges assigned to the data values "000", "001", "010", "011" "100", "101", "110" and "111." The specific relationship between the data programmed into the memory cell and the threshold voltage levels of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted to reduce data pattern sensitivity and even wear on the memory cells. Different encoding schemes can be used.

In many non-volatile memory systems, word lines and bit lines are used to access the individual memory cells. Typically, there is a one-to-one correspondence between word lines and voltage drivers. For example, systems that have thirty two word lines in a block would have thirty two voltage drivers, one for each word line. To meet the demand for higher capacity storage devices, systems are being designed with more memory cells, and therefore, more word lines per block. The increase in word lines requires an increase in the number of voltage drivers. However, space is limited.

SUMMARY

For program and read operations, there is a need for word line by word line control for the selected word line and a set of neighboring word lines. The rest of word lines will be at a level for unselected word lines and don't require word line by word line control. The technology described herein provides for a reduced number of drivers by having a common source for multiple unselected word lines and a limited number of individually controllable sources for word lines requiring word line by word line control.

One embodiment includes a first plurality of non-volatile storage elements; a first set of control lines in communication with the first set of non-volatile storage elements; a first source of signal; a set of individually controlled sources of signal; a first bridge circuit in communication with the first set of control lines, the set of individually controlled sources of signal and the first source of signal; and a control circuit in communication with the first bridge circuit. The first bridge circuit individually and selectively connects each of the first set of control lines to either the first source of signal or one of the set of individually controlled sources of signal, One embodiment includes a first plurality of non-volatile storage elements, a first set of control lines in communication with the first plurality of non-volatile storage elements, a common signal source, a set of individually controlled sources of signal, and a managing circuit in communication with the set of control lines. The managing circuit connects each control line of the first set of control lines to either the common signal source or one of the individually controlled sources of signal based on proximity to a selected control line for a data access operation. The managing circuit performs the data access operation while each control line of the set is connected to the common signal source or the separate signal source based on proximity to the selected control line for the data access operation.

One embodiment includes connecting each control line of a first set of control lines to either a first common signal source or a separate signal source of a plurality of separate signal sources based on proximity to a selected control line for a data access operation, and performing the data access operation while each control line of the first set of control lines is connected to the first common signal source or the separate signal source based on proximity to the selected control line for the data access operation. The first set of control lines are in communication with the non-volatile storage.

In one example implementation, the first set of control lines is a set of word lines and the word lines are connected to either the first common signal source or a separate signal source of the plurality of separate signals sources via decoders, signal lines, and a bridge circuit. In other implementations, the control lines could be types of controls lines other than word lines.

One embodiment includes receiving a request for a data access operation, determining a selected word line, determining a first set of word lines to be individually controlled for the data access operation, determining a second set of word lines that will not be individually controlled for the data access operation, and performing the data access operation including individually controlling the first set of word lines and providing a common signal to the second set of word lines.

One embodiment includes receiving a request for a data access operation, determining a selected word line, determining a first set of word lines to be individually controlled for the data access operation, determining a second set of word lines that will not be individually controlled for the data access operation, connecting each of the first set of word lines to separately controllable voltage signals, connecting each of the second set of word lines to a single voltage source; and performing the data access operation while the first set of word lines are connected to separately controllable voltage signals and the second set of word lines are connected to the single voltage source.

BRIEF DESCRIPTION OF THE DRAWINGS

FIG. 6 depicts an example set of threshold voltage distributions and describes a process for programming non-volatile memory.
FIGS. 7A-I show various threshold voltage distributions and describe a process for programming non-volatile memory.
FIG. 8 is a table depicting one example of an order of programming non-volatile memory.
FIG. 10 depicts a flow chart describing one embodiment of a process for programming non-volatile memory.
FIGS. 12A-C depict NAND strings.

DETAILED DESCRIPTION

Figure 1:
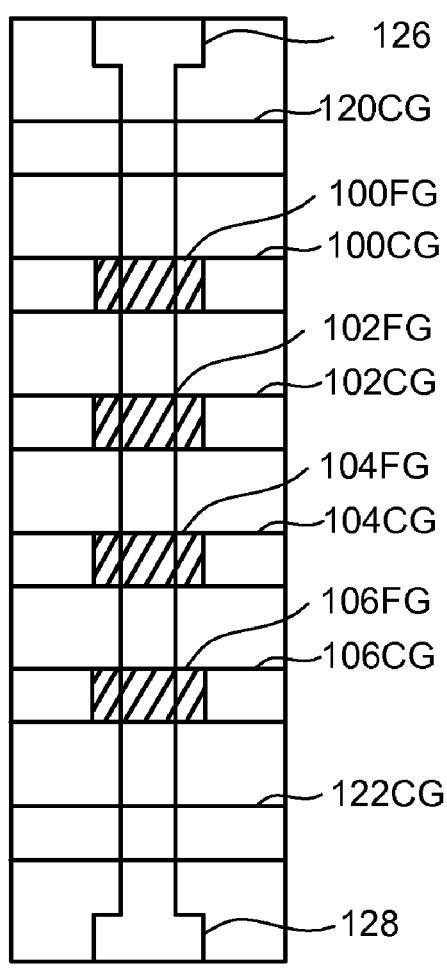
FIG. 1 is a top view of a NAND string.
Figure 2:
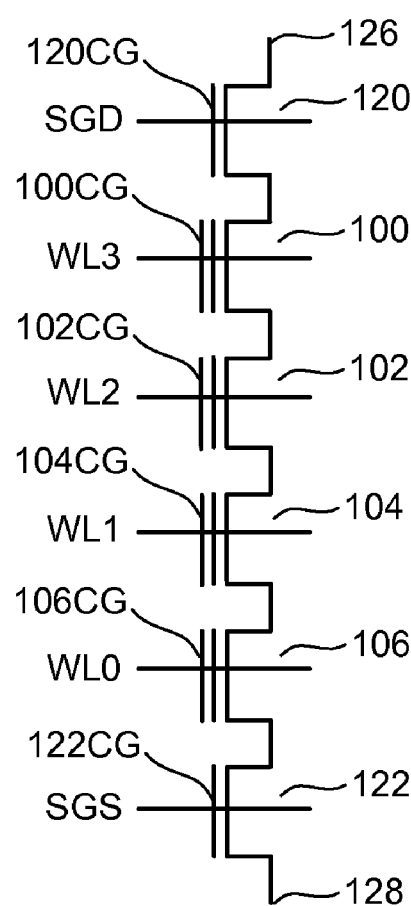
FIG. 2 is an equivalent circuit diagram of the NAND string.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Relevant examples of NAND type flash memories and their operation are provided in the following U.S. Patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices, in addition to NAND flash memory, can also be used. For example, non-volatile memory devices are also manufactured from memory cells that use a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric. Other types of non-volatile storage can also be used.

Figure 3:
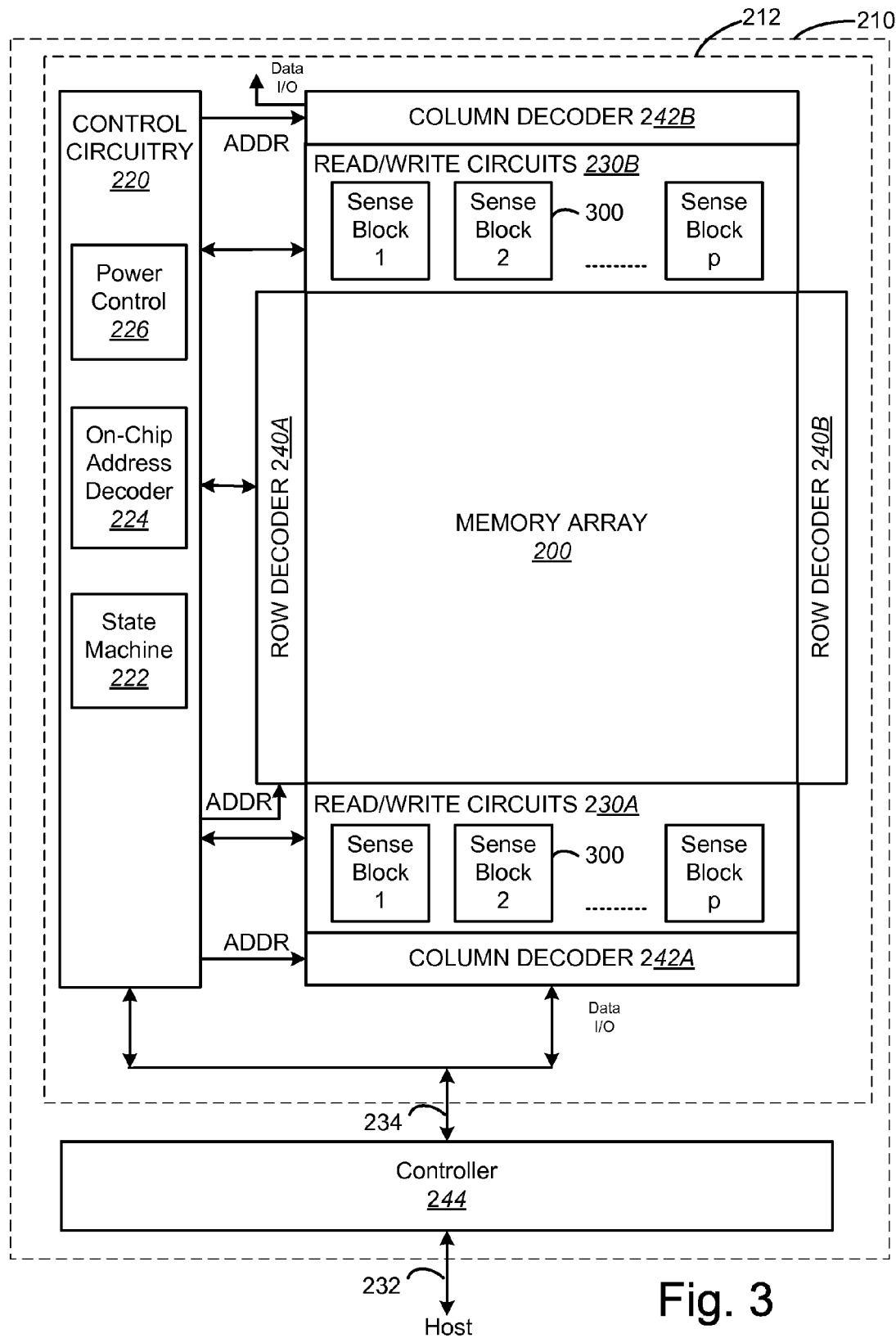
FIG. 3 is a block diagram of a non-volatile memory system.

FIG. 3 illustrates a memory device 210 having read/write circuits for reading and programming a page (or other unit) of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. Word lines and bit lines are examples of control lines. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing or control circuits. The one or more managing or control circuits perform the processes described herein.

Figure 4:
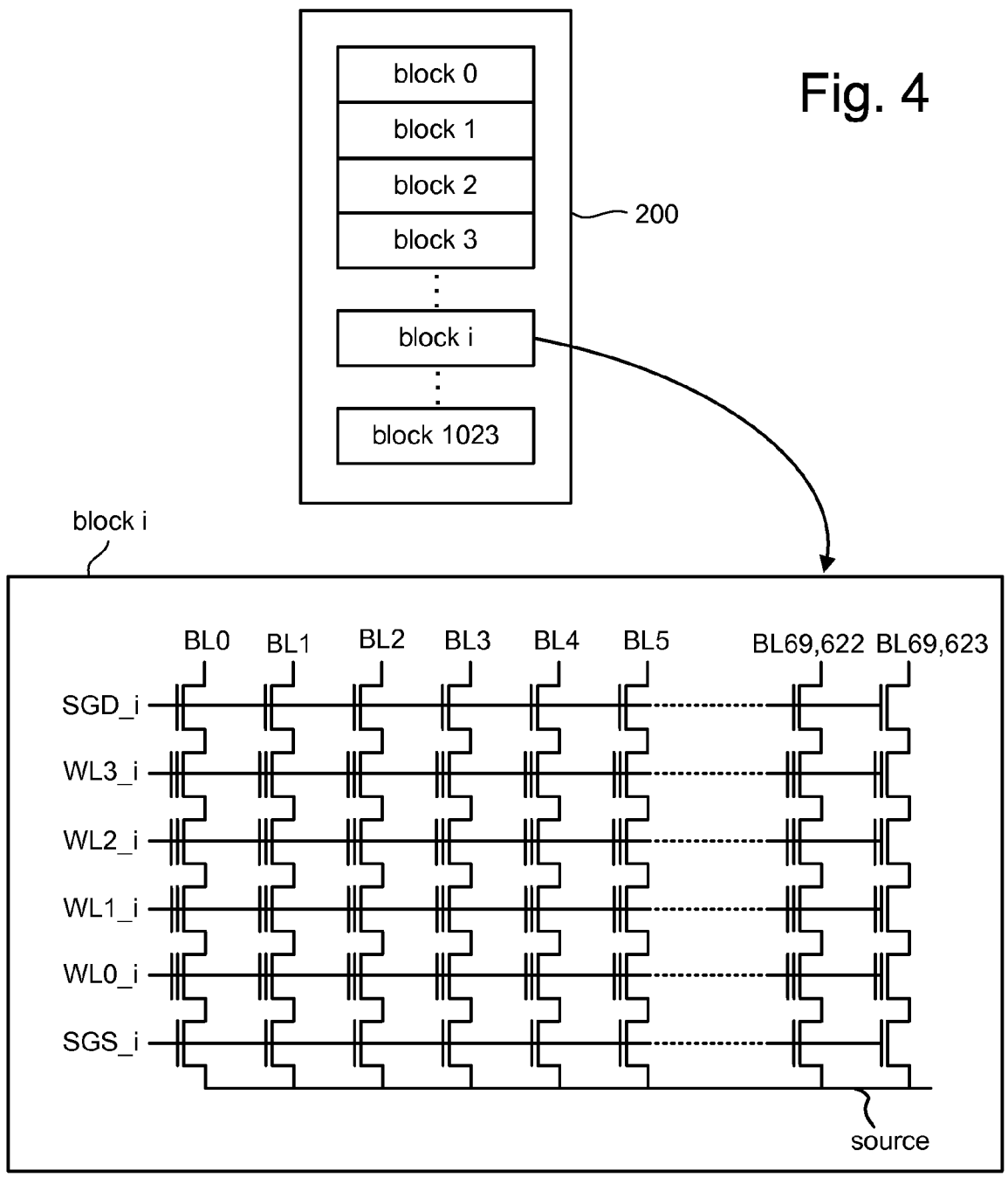
FIG. 4 is a block diagram depicting one embodiment of a memory array.

FIG. 4 depicts an exemplary structure of memory cell array 200. In one embodiment, the array of memory cells is divided into a large number of blocks (e.g., blocks 0-1023, or another amount) of memory cells. As is common for flash EEPROM systems, the block is the unit of erase. That is, each block contains the minimum number of memory cells that are erased together. Other units of eras can also be used.

A block contains a set of NAND stings which are accessed via bit lines (e.g., bit lines BL0-BL69,623) and word lines (WL0, WL1, WL2, WL3). FIG. 4 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Figure 5:
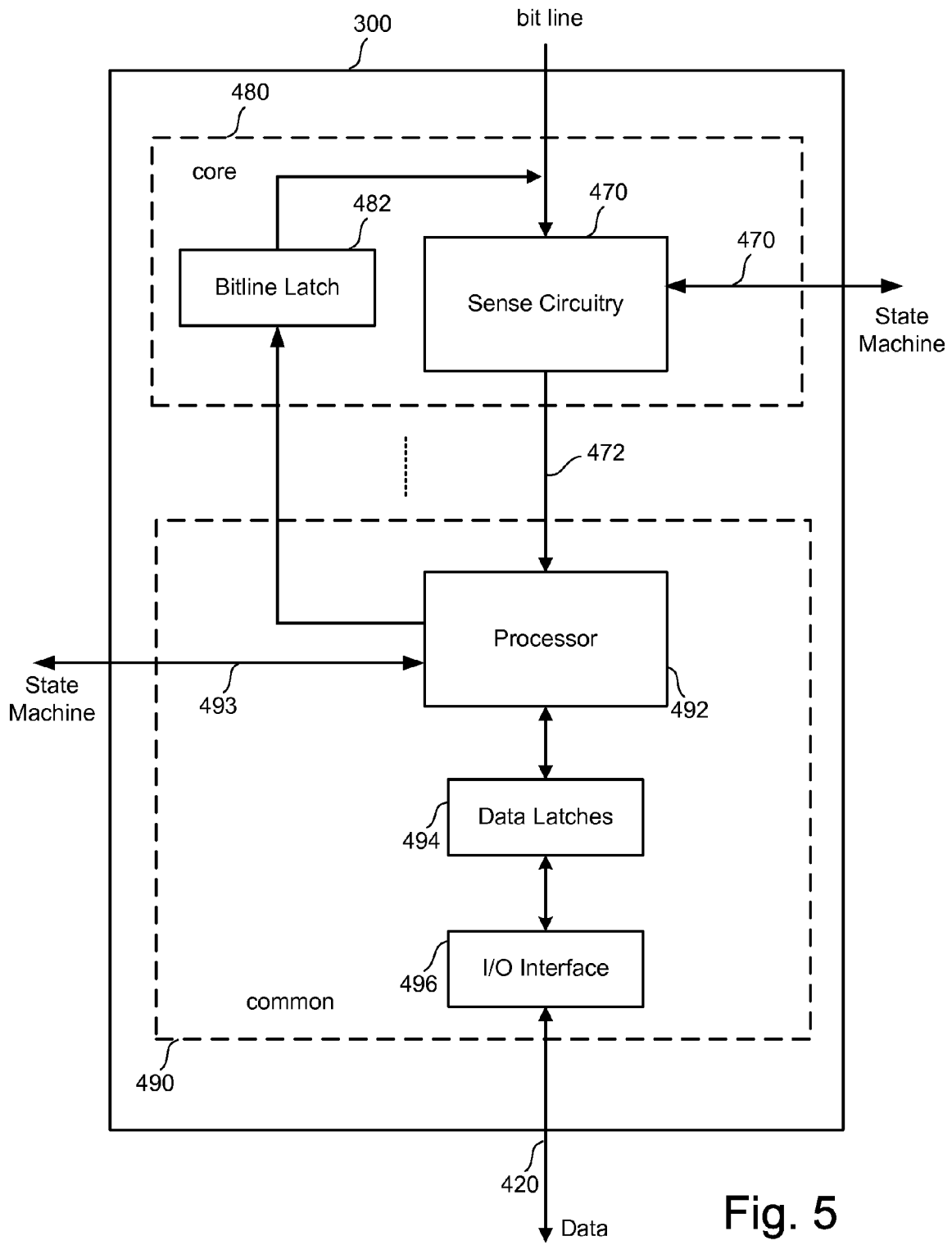
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. One example can be found in U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls (using power control 226) the supply of different control gate voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

Data latch stack 494 contains a stack of data latches corresponding to the sense module. In one embodiment, there are three (or four or another number) data latches per sense module 480. In one embodiment, the latches are each one bit.

During program or verify, the data to be programmed is stored in the set of data latches 494 from the data bus 420. During the verify process, Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions (or data states) for the memory cell array when each memory cell stores three bits of data. Other embodiment, however, may use more or less than three bits of data per memory cell (e.g., such as four or more bits of data per memory cell).

In the example of FIG. 6, each memory cell stores three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state corresponds to a unique value for the three bits stored in the memory cell. In one embodiment, S0=111, S1=110, S2=101, S3=100, S4=011, S5=010, S6=001 and S7=000. Other mapping of data to states S0-S7 can also be used. In one embodiment, all of the bits of data stored in a memory cell are stored in the same logical page. In other embodiments, each bit of data stored in a memory cell correspond to different logical pages. Thus, a memory cell storing three bits of data would include data in a first page, a second page and a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some prior art devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 6.

FIGS. 7A-7I disclose a three step process for programming non-volatile memory. Prior to the first step, the memory cells will be erased so that they are in the erase threshold distribution of state S0. The process of FIGS. 7A-7I assumes that each memory cell stores three bits of data, with each bit being in a different page. The first bit of data (the leftmost bit) is associated with the first page. The middle bit is associated with the second page. The rightmost bit is associated with the third page. The correlation of data states to data is as follows: S0=111, S1=110, S2=101, S3=100, S4=011, S5=010, S6=001 and S7=000. However, other embodiments can use other data encoding schemes.

Figure 7A:
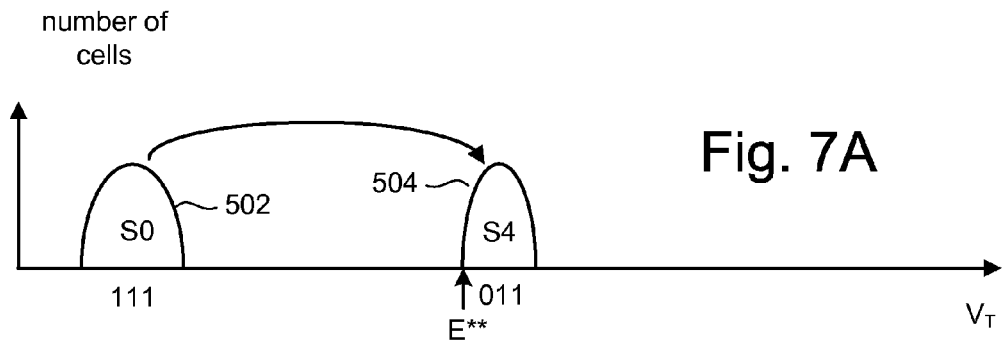
Figure 7B:
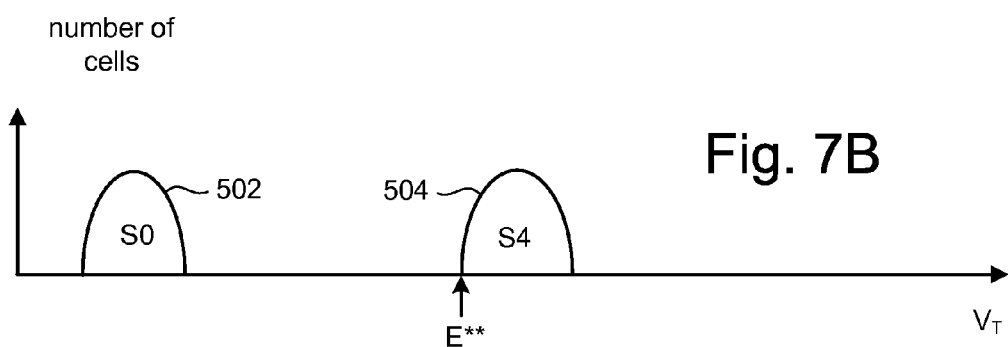

When programming the first page (as described in FIG. 7A), if the bit is to be data "1" then the memory cell will stay in state S0 (threshold voltage distribution 502). If the bit is to be data "0" then the memory cell is programmed to state S4 (threshold voltage distribution 504). After adjacent memory cells are programmed, capacitive coupling between adjacent floating gates may cause the state S4 to widen as depicted in FIG. 7B. State S0 may also widen, but there is sufficient margin between S0 and S1 to ignore the effect. More information about capacitive coupling between adjacent floating gates can be found in U.S. Pat. No. 5,867,429 and U.S. Pat. No. 6,657,891, both of which are incorporated herein by reference in their entirety.

Figure 7C:
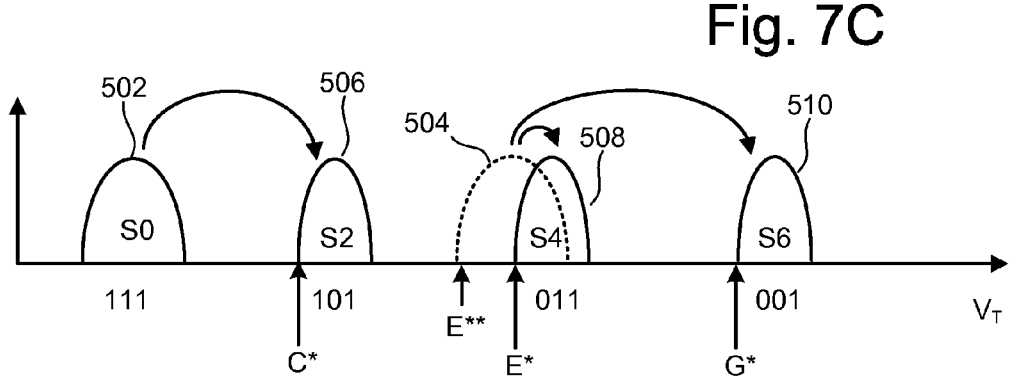

When programming the second page (see FIG. 7C), if the memory cell is in state S0 and the second page bit is data "1" then the memory cell stays in state S0. In some embodiments, the programming process for the second page will tighten threshold voltage distribution 501 to a new S0. If the memory cell was in state S0 and the data to be written to the second page is "0", then the memory cell is moved to state S2 (threshold voltage distribution 506). State S2 has a verify point (lowest voltage) of C*. If the memory cell was in state S4 and the data to be written to the memory cell is "1" then the memory cell remains in S4. However, state S4 is tightened by moving the memory cells from threshold voltage distribution 504 to threshold voltage distribution 508 for state S4, as depicted in FIG. 7C. Threshold voltage distribution 508 has a verify point of E* (as compared to E** of threshold voltage distribution 504). If the memory cell is in state S4 and the data to be written to the second page is a "0" then the memory cell has its threshold voltage moved to state S6 (threshold voltage distribution 510), with a verify point of G*.

Figure 7D:
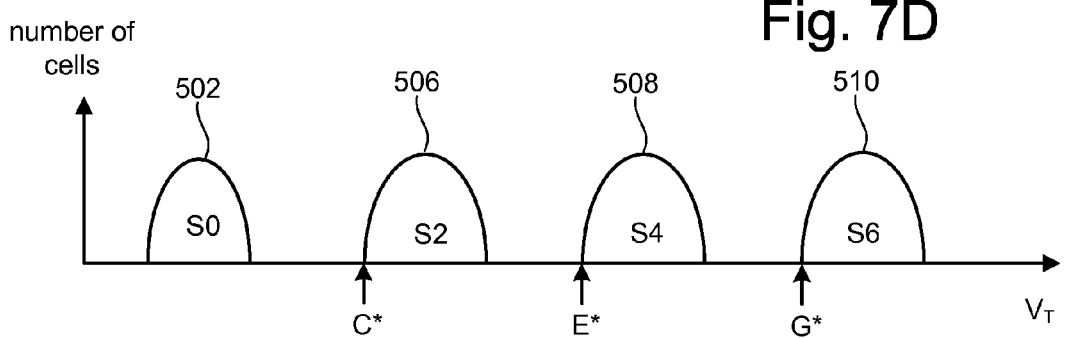

After the adjacent memory cells are programmed, the states S2, S4 and S6 are widened due to the floating gate to floating gate coupling, as depicted by threshold voltages distributions 506, 508 and 510 of FIG. 7D. In some cases, state S0 may also widen.

FIGS. 7E, 7F, 7G and 7H depict the programming of the third page. While one graph can be used to show the programming, the process is depicted in four graphs for visibility reasons. After the second page has been programmed, the memory cells are either in states S0, S2, S4 or S6. FIG. 7E shows the memory cell that is in state S0 being programmed for the third page. FIG. 7F shows the memory cell that is state S2 being programmed for the third page. FIG. 7G shows the memory cell that is in state S4 being programmed for the third page. FIG. 7H shows the memory cell that is in state S6 being programmed for the third page. FIG. 7I shows the threshold voltage distributions after the processes of FIGS. 7E, 7F, 7G and 7H have been performed on the population of memory cells (concurrently or serially).

If the memory cell is in state S0 and the third page data is "1" then the memory cell remains at state S0. If the data for the third page is "0" then the threshold voltage for the memory cell is raised to be in state S1, with a verify point of B (see FIG. 7E).

If the memory cells in state S2 and the data to be written in the third page is "1", then the memory cell will remain in state S2 (see FIG. 7F). However, some programming will be performed to tighten the threshold distribution 506 to a new state S2 with a verify point of C volts. If the data to be written to the third page is "0," then the memory cell will be programmed to state S3, with a verify point of D volts.

If the memory cell is in state S4 and the data to be written to the third page is "1" then the memory cell will remain in state S4 (see FIG. 7G). However, some programming will be performed so that threshold voltage distribution 508 will be tightened to new state S4 with a verify point of E. If the memory cell is in state S4 and the data to be written to the third page is "0" then the memory cell will have its threshold voltage raised to be in state S5, with a verify point of F.

If the memory cell is in state S6 and the data to be written to the third page is "1" then the memory cell will remain in state S6 (see FIG. 7H). However, there will be some programming so that the threshold voltage distribution 510 is tightened to be in new state S6, with a verify point at G. If the third page data is "0" then the memory cell will have its threshold voltage programmed to state S7, with a verify point at H. At the conclusion of the programming of the third page, the memory cell will be in one of the eight states depicted in FIG. 7I.

FIG. 8 depicts one example of an order for programming the pages of a set or memory cells. The table provides the order for programming with respect to four word lines (WL0, WL1, WL2 and WL3); however, the table can be adapted to accommodate more or less than four word lines. The first page of the memory cells connected to WL0 are programmed, followed by the programming of the first page of the memory cells connected to WL1, followed by the programming of the second page of the memory cells connected to WL0, followed by the programming of the first page of the memory cells connected to WL2, followed by the programming of the second page of the memory cells connected to WL1, etc.

Figure 9A:
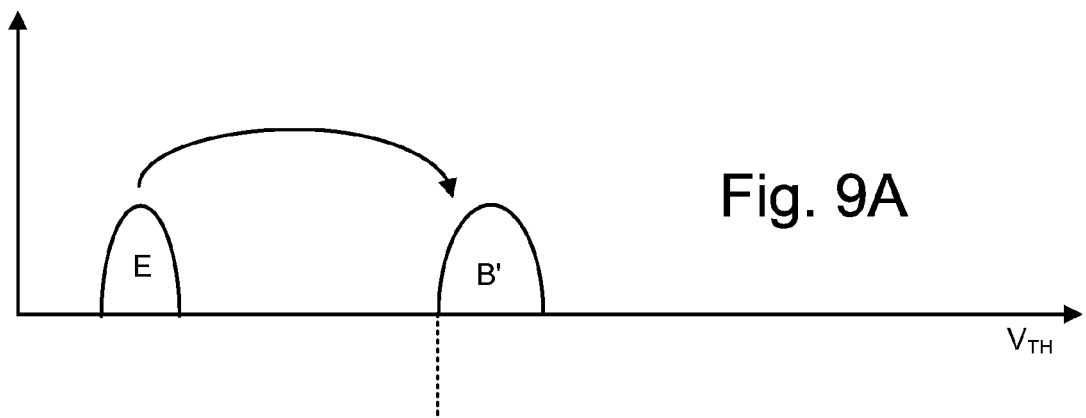
FIGS. 9A-C show various threshold voltage distributions and describe a process for programming non-volatile memory.
Figure 9B:
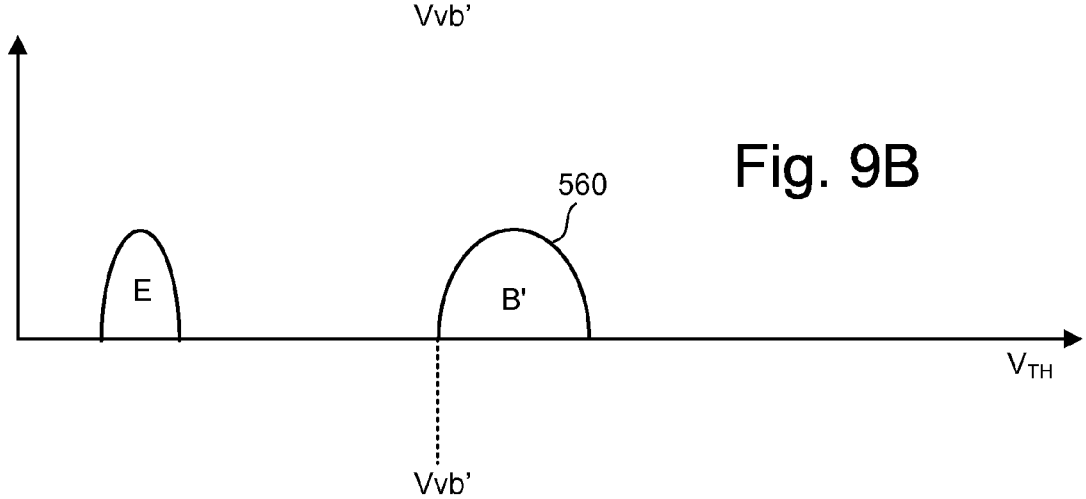
Figure 9C:
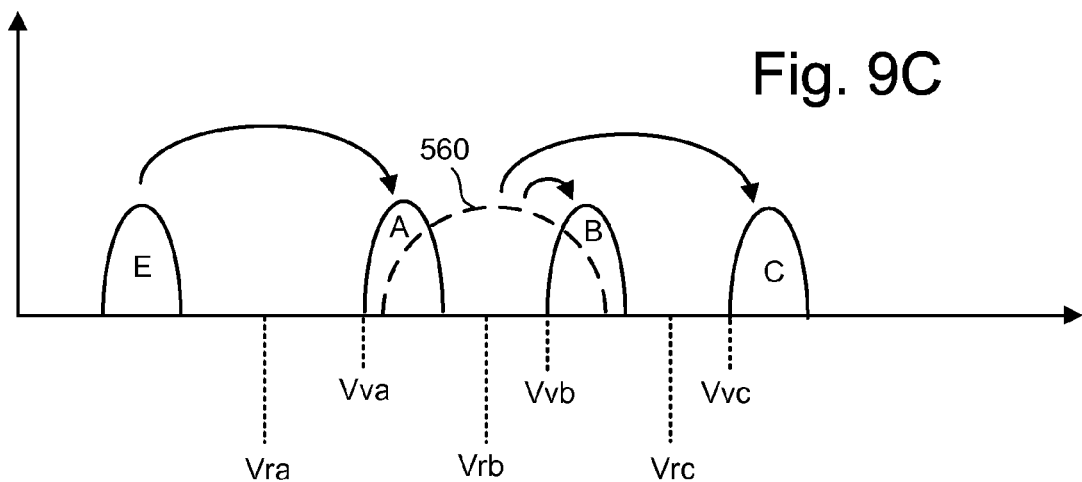

FIGS. 9A-C disclose another process for programming non-volatile memory for non-volatile memory cells that store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores two pages of data. For reference purposes these pages of data will be called upper page and lower page; however, they can be given other labels. With reference to state A for the process of FIGS. 9A-C, the upper page stores bit 0 and the lower page stores bit 1. With reference to state B, the upper page stores bit 1 and the lower page stores bit 0. With reference to state C, both pages store bit data 0.

The programming process of FIGS. 9A-C is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to state B'. FIG. 9A therefore shows the programming of memory cells from state E to state B'. State B' depicted in FIG. 9A is an interim state B; therefore, the verify point is depicted as Vvb', which is lower than Vvb.

In one embodiment, after a memory cell is programmed from state E to state B', its neighbor memory cell (WLn+1) in the NAND string will then be programmed with respect to its lower page. This will have the effect of widening the threshold voltage distribution for state B' to that depicted as threshold voltage distribution 560 of FIG. 9B. This apparent widening of the threshold voltage distribution will be remedied when programming the upper page.

FIG. 9C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 550 and the upper page data is to remain at 1, then the memory cell will be programmed to final state B. If the memory cell is in intermediate threshold voltage distribution 560 and the upper page data is to become data 0, then the threshold voltage of the memory cell will be raised so that the memory cell is in state C. Although FIGS. 9A-C provide an example with respect to four data states and two pages of data, the concepts taught by FIGS. 9A-C can be applied to other implementations with more or less than four states and different than two pages.

FIG. 10 is a flow chart describing a programming process for programming memory cells connected to a selected word line. In one embodiment, the process of FIG. 10 is used to program a block of memory cells. In one implementation of the process of FIG. 10, memory cells are pre-programmed in order to maintain even wear on the memory cells (step 550). In one embodiment, the memory cells are preprogrammed to state S7, a random pattern, or any other pattern. In some implementations, pre-programming need not be performed.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of cells. In one embodiment, after erasing the memory cells, all of the erased memory cells will be in state S0 (see FIG. 6).

At step 554, soft programming is performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells closer to the erase verify level. For example, looking at FIG. 6, step 554 can include tightening the threshold voltage distribution associated with state S0. In step 556, the memory cells of the block are programmed as described herein. The process of FIG. 10 can be performed at the direction of the state machine using the various circuits described above. In other embodiments, the process of FIG. 10 can be performed at the direction of the controller using the various circuits described above. After performing the process of FIG. 10, the memory cells of the block can be read.

Figure 11:
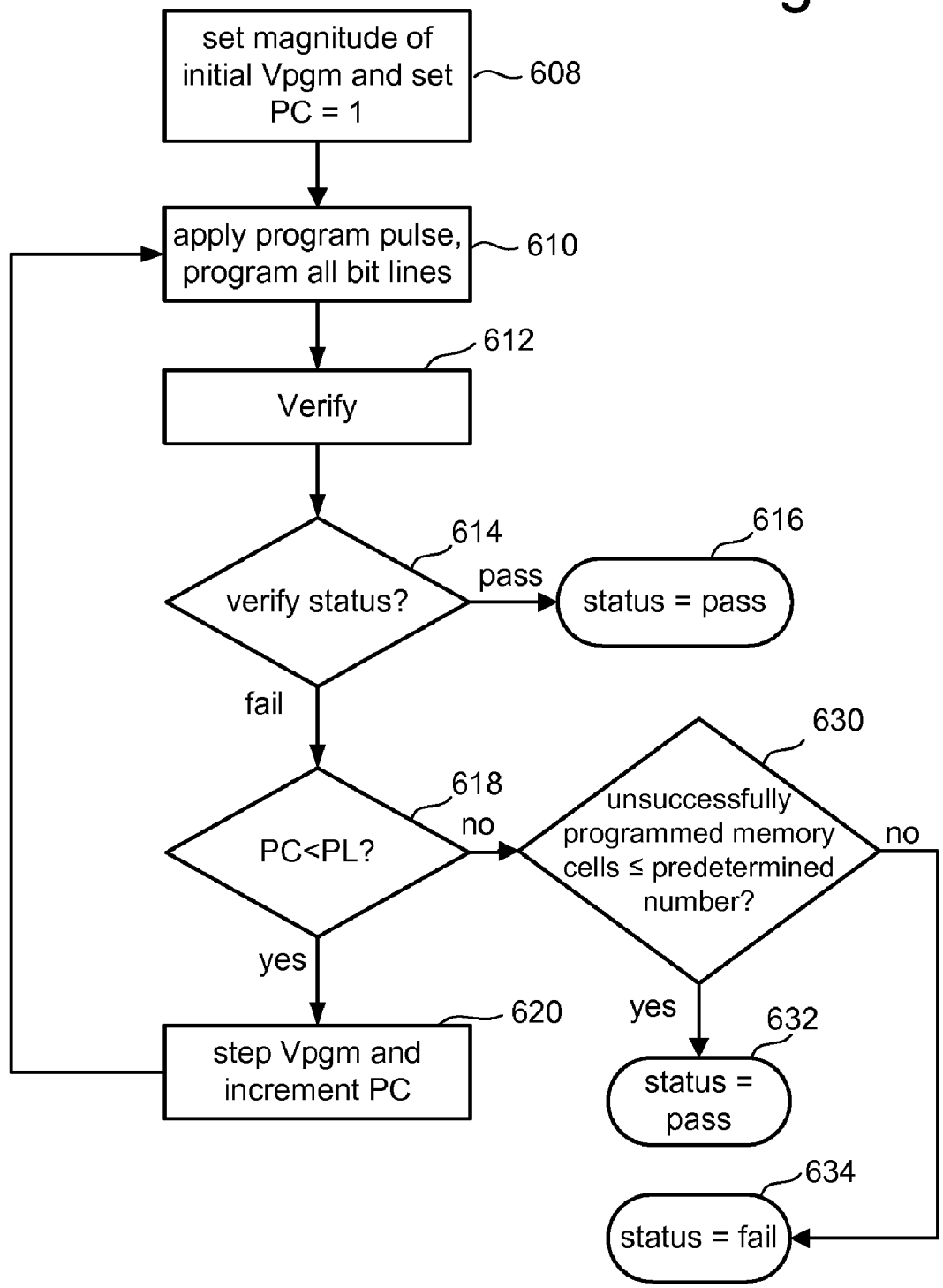
FIG. 11 depicts a flow chart describing one embodiment of a process for programming non-volatile memory elements.

FIG. 11 is a flow chart describing one embodiment of a process for performing programming on memory cells connected to a common word line. The process of FIG. 10 can be performed one or multiple times during step 556 of FIG. 10. For example, the process of FIG. 11 can be used to perform the full sequence programming of FIG. 6, in which case the process of FIG. 11 would be performed once for each word line. In one embodiment, the programming process is performed in an order that starts from the word line closest to the source line, working toward the bit line. The process of FIG. 11 can also be used to perform the programming of a page of data for a word line, with respect to the programming process of FIGS. 7A-I, in which case the process of FIG. 11 would be performed three times for each word line. The process of FIG. 11 can also be used to perform the programming of a page of data for a word line with respect to the programming process of FIGS. 9A-C, in which case the process of FIG. 11 would be performed two times for each word line. Other arrangements can also be used. The process of FIG. 11 is performed at the direction of the state machine 222.

Typically, the program voltage applied to the control gate during a program operation is applied as a series of program pulses. In between programming pulses are a set of verify pulses to enable verification. In many implementations, the magnitude of the program pulses is increased with each successive pulse by a predetermined step size. In step 608 of FIG. 11, the programming voltage (Vpgm) is initialized to the starting magnitude (e.g., ~12-16V or another suitable level) and a program counter PC maintained by state machine 222 is initialized at 1. In step 610, a program pulse of the program signal Vpgm is applied to the selected word line (the word line selected for programming). The unselected word lines receive one or more boosting voltages (e.g., ~9 volts) to perform boosting schemes known in the art. If a memory cell should be programmed, then the corresponding bit line is grounded. On the other hand, if the memory cell should remain at its current threshold voltage, then the corresponding bit line is connected to $V_{DD}$ to inhibit programming. More information about boosting schemes can be found in U.S. Pat. No. 6,859,397 and U.S. patent application Ser. No. 11/555,850, both of which are incorporated herein by reference.

In step 610, the program pulse is concurrently applied to all memory cells connected to the selected word line so that all of the memory cells connected to the selected word line are programmed together. That is, they are programmed at the same time (or during overlapping times). In this manner all of the memory cells connected to the selected word line will concurrently have their threshold voltage change, unless they have been locked out from programming.

In step 612, the states of the selected memory cells are verified using the appropriate set of target levels. Step 612 of FIG. 10 includes performing one or more verify operations. In general, during verify operations and read operations, the selected word line is connected to a voltage, a level of which is specified for each read and verify operation (e.g. see verify levels B, C, D, E, F, G and H of FIG. 7I) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge the corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; and (4) U.S. Patent Publication 2006/0221692, titled "Compensating for Coupling During Read Operations of Non-Volatile Memory," Inventor Jian Chen, filed on Apr. 5, 2005.

If it is detected that the threshold voltage of a selected memory cell has reached the appropriate target level, then the memory cell is locked out of further programming by, for example, raising its bit line voltage to Vdd during subsequent programming pulses.

Looking back at FIG. 10, in step 614 it is checked whether all of memory cells have reached their target threshold voltages. If so, the programming process is complete and successful because all selected memory cells were programmed and verified to their target states. A status of "PASS" is reported in step 616. Note that in some implementations, in step 614 it is checked whether at least a predetermined number of memory cells have been properly programmed. This predetermined number can be less than the number of all memory cells, thereby allowing the programming process to stop before all memory cells have reached their appropriate verify levels. The memory cells that are not successfully programmed can be corrected using error correction during the read process.

If, in step 614, it is determined that not all of the memory cells have reached their target threshold voltages, then the programming process continues. In step 618, the program counter PC is checked against a program limit value (PL). One example of a program limit value is 20; however, other values can be used. If the program counter PC is not less than the program limit value, then it is determined in step 630 whether the number of memory cells that have not been successfully programmed is equal to or less than a predetermined number. If the number of unsuccessfully programmed memory cells is equal to or less than the predetermined number, then the programming process is flagged as passed and a status of PASS is reported in step 632. In many cases, the memory cells that are not successfully programmed can be corrected using error correction during the read process. If, however, the number of unsuccessfully programmed memory cells is greater than the predetermined number, the program process is flagged as failed and a status of FAIL is reported in step 634.

If, in step 618, it is determined that the Program Counter PC is less than the Program Limit value PL, then the process continues at step 620 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 620, the process loops back to step 610 and another program pulse is applied to the selected word line.

When programming a flash memory cell (e.g. during step 610 of FIG. 11), a program voltage is applied to the control gate and the bit line is grounded. Electrons from the P-well are injected into the floating gate. When electrons accumulate in the floating gate, the floating gate becomes negatively charged and the threshold voltage of the memory cell is raised. To apply the program voltage to the control gate of the memory cell being programmed, that program voltage is applied on the appropriate word line. As discussed above, that word line is also connected to one memory cell in each of the other NAND strings that utilize the same word line. A problem arises when it is desired to program some memory cells on a word line without programming all memory cells connected to the same word line. Because the program voltage is applied to all the memory cells connected to that word line, an unselected memory cell (a cell that is not to be programmed) on the word line may become inadvertently programmed. This unintentional programming of the unselected memory cell on a selected word line is referred to as program disturb.

Several techniques can be employed to prevent program disturb. In one technique, known as self boosting, the unselected bit lines are electrically isolated and a pass voltage Vpass (e.g. eight-ten volts) is applied to the unselected word lines during programming. The unselected word lines couple to the unselected bit lines, causing a voltage to exist in the channel of the unselected bit lines, which tends to reduce program disturb.

Another technique for reducing program disturb is called Local Self Boosting ("LSB"). The LSB technique tends to isolate the channel of the previously programmed memory cells from the channel of the memory cells being inhibited. The bit line for the memory cell being programmed is set at zero volts and the bit line for the memory cell being inhibited is at Vdd (supply voltage). The program voltage is driven on the selected word line. The word lines neighboring the selected word line are at zero volts AN isolation voltage) and the remaining unselected word lines are at Vpass. FIG. 12A provides an example of a NAND string being subjected to LSB. The NAND string includes memory cells 804, 806, 808, 810, 812, 814, 816 and 818. Each memory cell has a control gate (CG), floating gate (FG), and source/drain regions 830. At one end of the NAND string is a source side select gate 822, and at the other end of the NAND string is a drain side select gate 824. The NAND string is connected to the bit line via bit line contact 834 and to a source line via source line contact 832. As can be seen, the selected memory cell 812 receives the program voltage Vpgm, the two neighbors (810 and 814) receive zero volts, and the other unselected word lines receive Vpass.

Another process for reducing program disturb is called Erased Area Self Boosting ("EASB"), in which only the source side neighbor to the selected word line is at zero volts, and all other unselected word lines receive Vpass. U.S. Pat. No. 6,859,397 describes program disturb, LSB, EASB, and other techniques used during programming to reduce disturb.

Another process for reducing program disturb is referred to as Revised Erased Area Self Boosting ("REASB"). REASB is similar to EASB, except that between the word line receiving zero volts (or another isolation voltage) and the selected word line is a word line receiving an intermediate voltage (between Vpass and zero volts). For example, FIG. 12B depicts the NAND string being subjected to REASB. Note that memory cell 812 is selected for programming, and is receiving the program voltage Vpgm. The memory cell next to the selected memory cell receives intermediate voltage Vint. Memory cell 808 receives the isolation voltage (e.g. 0 volts). All of the other unselected memory cells receive Vpass. U.S. patent application Ser. No. 11,535,634, titled, "Apparatus with Reduced Program Disturb in Nonvolatile Storage," by Gerrit Jan Hemink and Shih-Chung Lee, filed Sep. 27, 2006, also describes various techniques performed to reduce program disturb. Note that the techniques described above are for reducing program disturb performed during step 610 in FIG. 11.

During traditional read processes, the selected word line (the word line connected to the memory cells being read) will receive a compare voltage, referred to as Vcgr (Vcgv during a verify process). The remaining word lines will receive Vread, which is a voltage high enough to ensure that the nonselected memory cells all turn on and conduct current. However, there are various other read techniques that apply other voltages to unselected word lines. For examples, United States Patent Publication 2007/0206426, published on Sep. 6, 2007, describes a system for reading data that applies a compensation voltage to a word line that neighbors the selected word line. FIG. 12C graphically depicts this process being applied to a NAND string. As can be seen in FIG. 12C, the selected memory cell 812 is receiving Vcgr, neighbor memory cell 814 receives Vreadx and all other unselected word lines receive Vread. The voltage Vreadx is dependent on how much compensation is needed to compensate for floating gate to floating gate coupling. Other techniques utilize other voltages for other unrelated word lines.

As described above, during programming most of the word lines will receive Vpass. However, a subset of word lines will need to be individually controlled to apply zero volts, another isolation voltage other than zero volts, and one or more intermediate voltages, etc. Similarly, during a read process most word lines will receive Vread; however, some word lines need to be individually controlled. Thus, for program and read operations, the system needs individual (word line-by-word line) control for the selected word line and a few other word lines. The remaining unselected word lines, however, can be at a level that is common for most unselected word lines and does not require individual (word line-by-word line) control.

One embodiment includes dividing all the word lines into groups of neighboring word lines. Consider an example where a NAND string includes 64 memory cells. Such a system would require 64 word lines. In one example, the word lines are broken into eight groups of adjacent eight word lines. Group zero includes word lines WL0-WL7, group one includes word lines WL8-WL15, group two includes word lines WL16-WL23, group three includes word lines WL24-WL31, group four includes word lines WL32-WL39, group five includes word lines WL40-WL47, group six includes word lines WL48-WL55, and group seven includes word lines WL56-WL63.

In one embodiment, upon receiving a request for a data access operation, the system will determine which word line is the selected word line and which group includes that selected word line. The group including the selected word line and those groups adjacent to the group containing the selected word line will be individually controllable. Thus, the choice of which word lines to individually control is based on proximity to the selected word line. The other groups of word lines will all receive a common signal such as Vread or Vpass.

One benefit of the technology described herein is that a reduced number of drivers can be used for driving the word lines. Rather than having 64 word line drivers, the non-volatile memory system can be designed with a reduced number of drivers and voltage generators (or other types of sources). In one example, there can be 25 word line drivers. Twenty-four of the word line drivers will be used to individually control three groups of eight word lines discussed above and the twenty-fifth word line driver can be used to drive either Vread or Vpass to the word lines outside those three groups. Of the twenty four word line drivers that will be individually controllable, these word line drivers are grouped into three sets. The first set includes eight drivers referred to as CGA0-CGA7. The second set includes eight word line drivers CGB0-CGB7. The third group includes drivers CGC0-CGC7.

Figure 13:
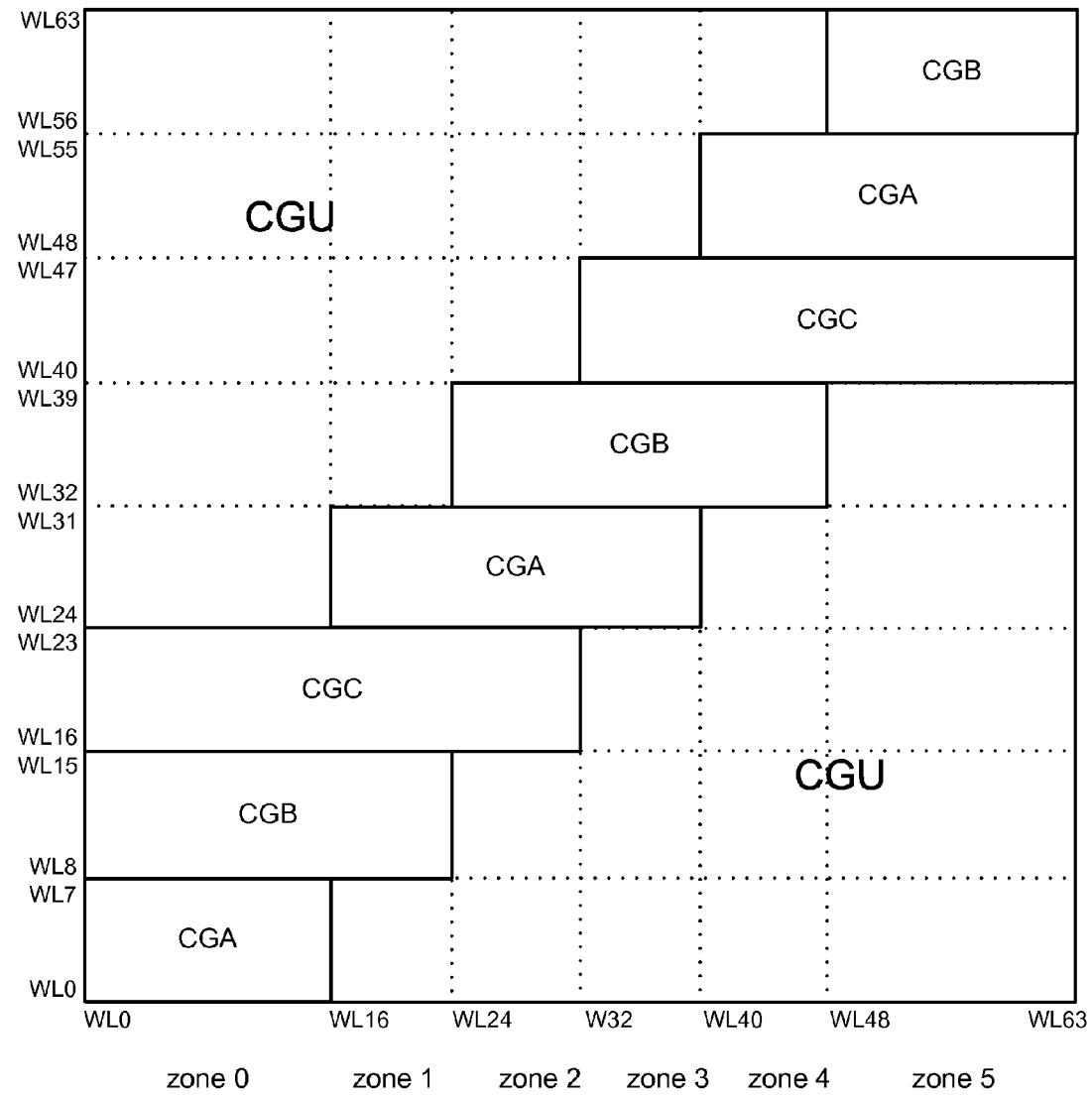
FIG. 13 depicts how word lines can be grouped and selectively connected to individually controllable sources of signal.

FIG. 13 is a graph that describes how word lines are connected to various drivers (and voltage generators). The vertical axis lists each word line and is used to indicate how a word line is connected. The horizontal axis lists all the word lines and represents the word line selected for programming or reading. After identifying which word line is selected for programming/reading, that word line is found on the horizontal axis. Then traversing up the graph in a vertical direction, the assignment of how each of the word lines are connected can be found. In the embodiment of FIG. 13, groups 0, 3 and 6 will connect to either CGU and CGA; groups 1, 4 and 7 will connect to either CGB and CGU and groups 2 and 5 will connect to either CGC and CGU. For example, if any of word lines WL0-WL15 are selected for programming/reading, then WL0-WL7 are connected to CGA0-CGA7, WL8-WL15 are connected to CGB0-CGB7, WL16-WL23 are connected to CGC0-CGC7, and WL24-WL63 are connected to CGU. Note that CGU is a common voltage provided to the unselected word lines and can be Vread, Vpass, or something similar. If the word line selected for programming includes either WL32-WL39, then word lines WL0-WL23 are connected to CGU, WL24-WL31 to CGA0-CGA7, word lines WL32-WL39 are connected to CGB0-CGB7, word lines WL40-WL47 are connected to CGC0-CGC7, and word lines WL48-WL63 are connected to CGU.

Figure 14:
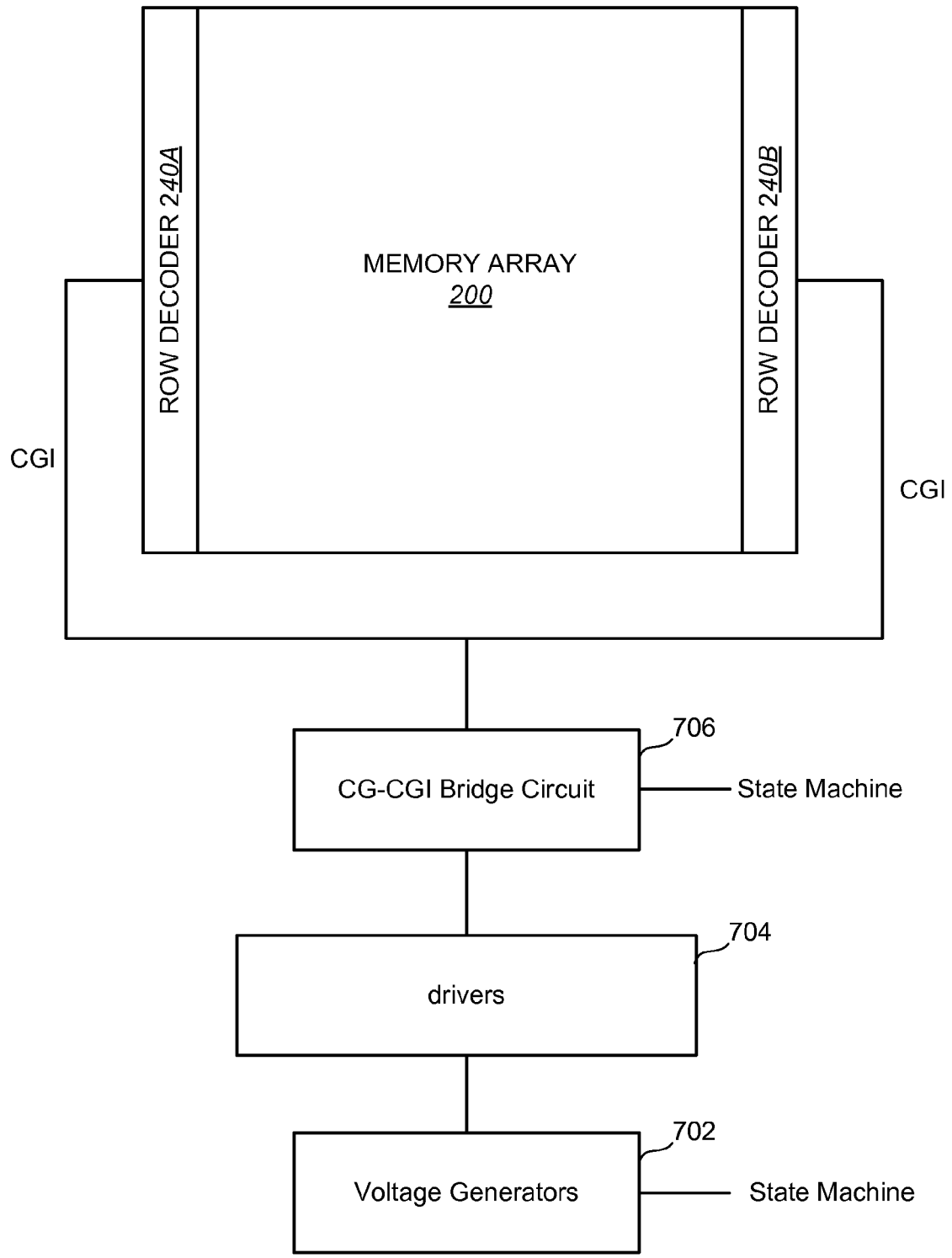
FIG. 14 is a block diagram of a portion of a non-volatile storage system.

FIG. 14 depicts one embodiment of components of system/chip 212 that can implement the switching depicted in the graph of FIG. 13. FIG. 14 shows voltage generators 702, drivers 704 and bridge circuit 706, all of which are within power control circuit 226; however, these components can be part of other circuits in the system. Voltage generators 702 receive a signal from state machine 222 indicating which voltages to create, therefore, they are individually controllable. Voltage generators 702 will include at least twenty five voltage generators to create at least twenty five voltages. In other embodiments, more or less that twenty five voltage generators can be used. Each of the voltage generators are provided to drivers 704. Thus, in one embodiment, there are twenty five drivers that provide controllable voltages. However, in other embodiments, more or less than twenty five drivers can be used. The drivers are used to connect to and drive the various voltages created by voltage generators 702. In one embodiment, the drivers in combination with the voltage generators are considered to be voltage sources. On other embodiments, the drivers are considered to voltage sources or the voltage generators are considered to be voltage sources. A source of signal is not limited to a device that first creates the signal.

The voltages are provided from the twenty five drivers to bridge circuit 706. Bridge circuit 706 is connected to all of the word lines via CGI lines and decoders. In the example above, there are sixty four word lines and twenty five drivers. Therefore, the input to bridge circuit 706 will include twenty five signals, twenty four for each individually controllable word line and one for the common word line signal. The output of bridge circuit 706 will include sixty four signal lines, which are referred to as CGI Lines. Bridge circuit 706 connects the appropriate drivers to the CGI signal lines. The CGI lines are connected to the word lines via the decoders. As described above, the word lines are connected to the memory cells. In one embodiment, thirty two CGI lines connect to word lines at one side of array 200 via decoders 240A and thirty two CGI lines connect to word lines at the other side of array 200 via decoders 240B.

Figure 15:
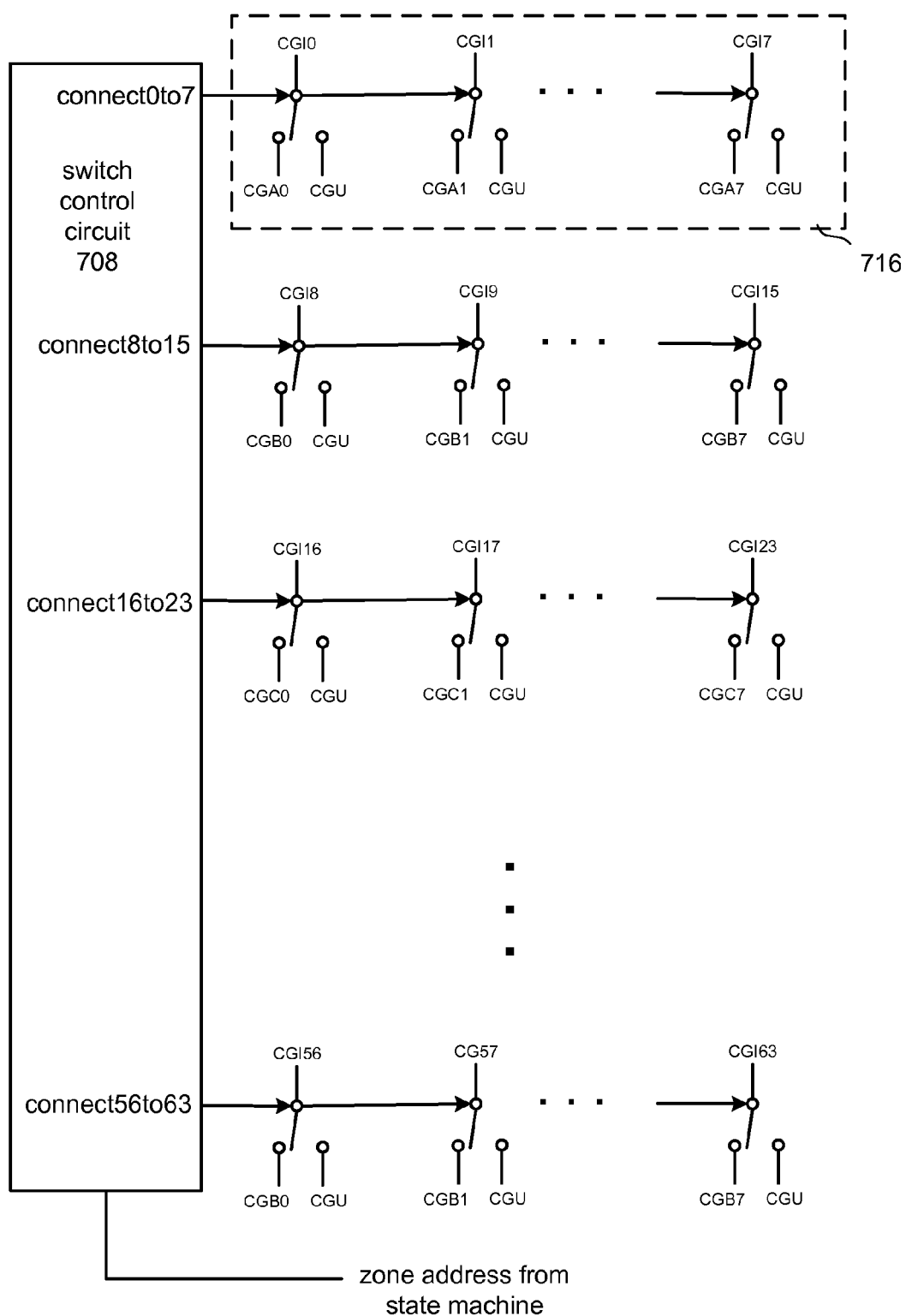
FIG. 15 is a block diagram of a bridge circuit.

In one embodiment, bridge circuit 706 includes a number of switches. FIG. 15 depicts one example of the components of bridge circuit 706. Switch 706 includes switch control circuit 708, which receives a zone address from state machine 222. Looking back on the graph of FIG. 13, the horizontal axis is broken into six zones or word lines (zone 0, zone 1, zone 2, zone 3, zone 4 and zone 5). Zone 0 corresponds to WL0-WL15, zone 1 corresponds to WL16-WL23, zone 2 corresponds to WL24-WL31, zone 3 corresponds to WL32-WL39, zone 4 corresponds to WL40-WL47, and zone 5 corresponds to WL48-WL63. An indication of the appropriate zone will be sent from the state machine to switch control circuit 708. In another embodiment, the state machine will send a memory address or word line address to switch control circuit 708. The information received by switch control circuit 708 from the state machine is used to determine whether to connect word lines to the common voltage or an individually controllable voltage.

Figures 16, 17:
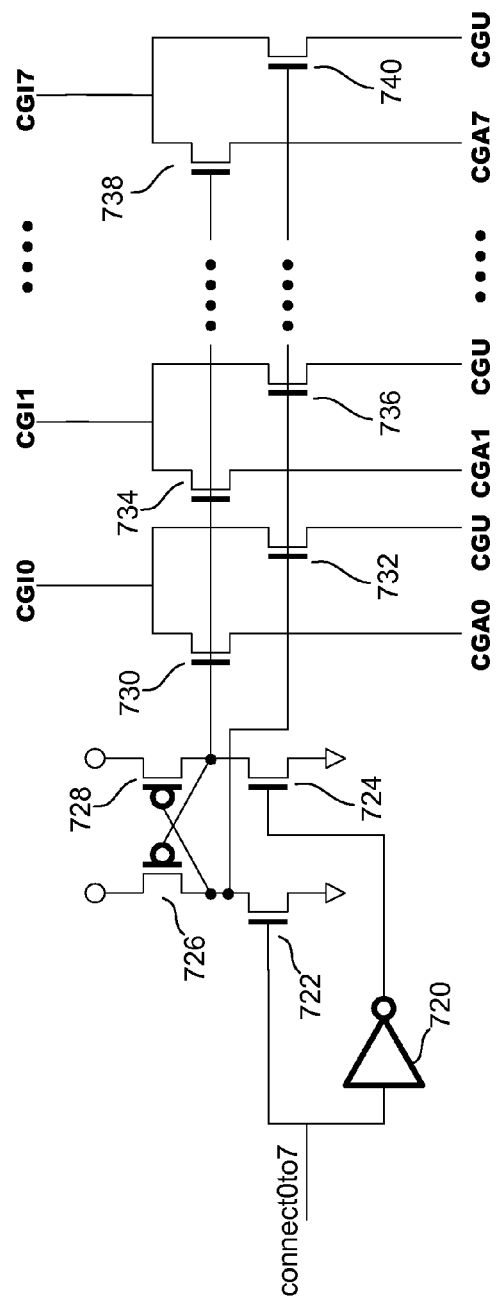
FIG. 16 is a truth table for a bridge circuit.
FIG. 17 is a schematic of a bridge circuit.

FIG. 16 is a truth table which describes the operation of switch control circuit 708. The first column (WL0-15) corresponds to zone 0, the second column (WL16-23) corresponds to zone 1, the third column (WL24-31) corresponds to zone 2, the fourth column (WL32-39) corresponds to zone 3, the fifth column (WL40-47) corresponds to zone 4, and the sixth column (WL48-63) corresponds to zone 5. The output of switch control circuit 708 includes eight output signals (connect0to7, connect8to15, connect16to23, connect24to31, connect32to29, connect40to47, connect48to55, and connect56to63). The table of FIG. 16 indicates the values on each of those output signals based on which zone is selected by state machine 222. Those eight output signals are used to control a set of switches. For example, as depicted in FIG. 15, the output signal connect0to7 is connected to switches for signal line CGI0, CGI1, . . . CGI7. These signal lines are connected to word lines. For example, CGI0 connects to word line WL0, CGI1 connects to word line WL1, . . . CGI7 is connected to word line WL7. The switch for CGI0 chooses between inputs CGA0 and CGU, the switch for CGI1 switches between input CGA1 and CGU . . . the switch for CGI7 switches between CGA7 and CGU. As can be seen from FIG. 13, each word line is switched between CGU and a pre-selected one of CGA CGB or CGC.

FIG. 17 is a schematic diagram depicting one embodiment for implementing the switches of FIG. 15. For example, FIG. 17 depicts one implementation of the components within box 716 of FIG. 15. The components of FIG. 17 can also be used to implement the other sets of switches for the other output signals. FIG. 17 shows the output of connect0to7 being sent to a base of transistor 722 and the input to inverter 720. The output of inverter 720 is provided to the base of transistor 724. Transistor 722 is also connected to ground, transistor 726 and transistor 728. Transistors 726 and 728 are connected to a power source. The base of transistor 730 receives its input from transistors 726, 728 and 724. Transistor 730 is connected to signal CGI0 and CGA0, and is used to selectively connect CGI0 to CGA0. Transistors 734 . . . 738 are controlled in the same manner as transistor 730. The base of transistor 732 receives its input from transistors 722 and 726. Transistors 736 . . . 740 are controlled in the same manner as transistor 732. Transistor 732 is used to selectively connect CGI0 to CGU, transistor 734 is used to selectively connect CGI1 to CGA1, transistor 736 is used to selectively connect CGI1 to CGU, . . . transistor 738 is used to selectively connect CGI7 to CGA7, and transistor 740 is used to connect CGI7 to CGU.

Figure 18:
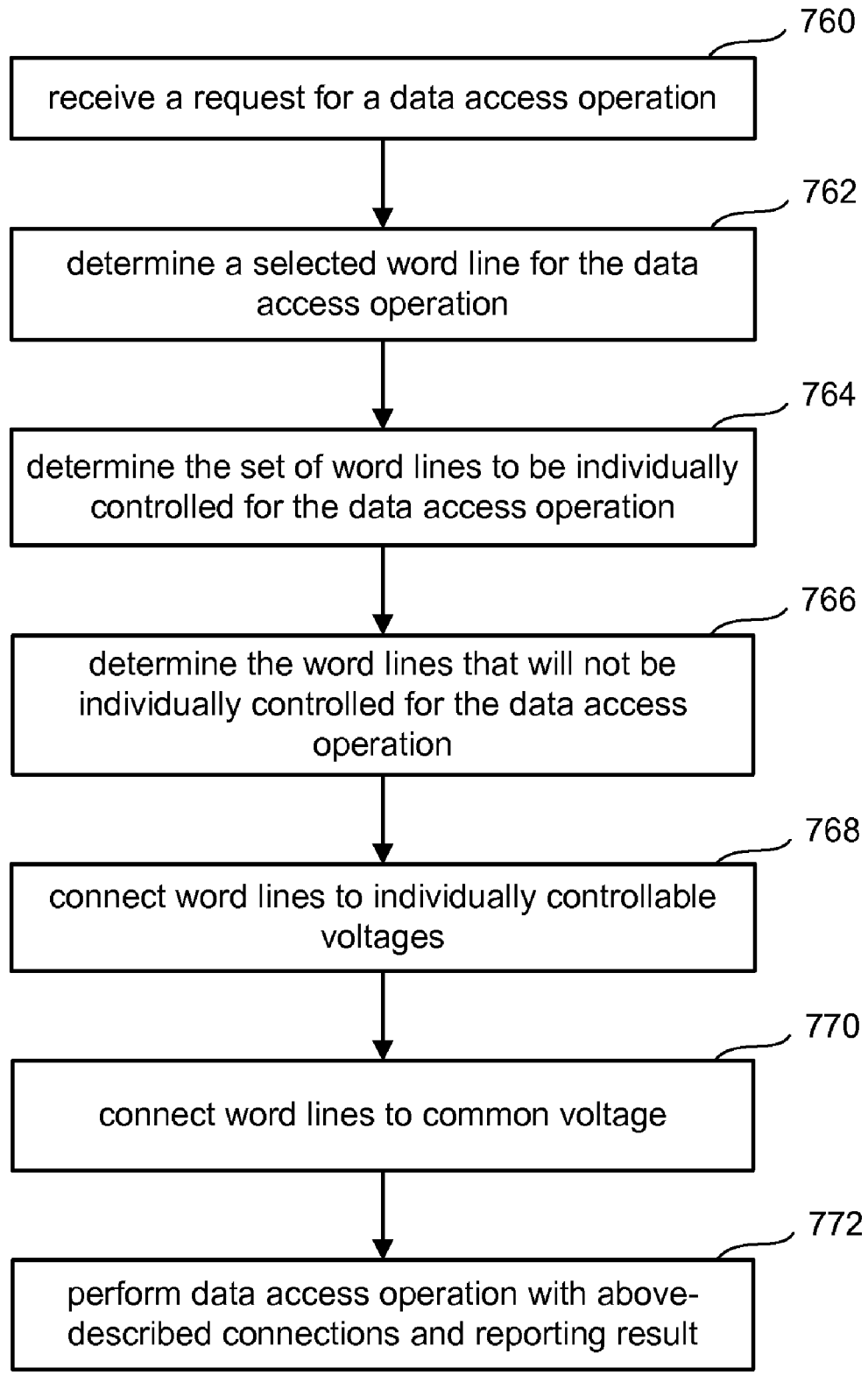
FIG. 18 is a flow chart describing one embodiment of a process for operating a non-volatile storage system.

FIG. 18 is a flow chart describing one embodiment of a process for operating the system of FIG. 14. In step 760, a request for a data access operation is received by control circuitry 220. A data access operation can include a programming operation or a read operation. In other embodiments, other types of data access operations can also be utilized. In some implementations, the request for data access operation can be received by controller 244. In step 762, a selected word line is determined for the data access operation. The selected word line can be determined by controller 244 or state machine 222. The determination of which word line is the selected word line depends on which memory cells are being addressed for the programming or read operation. This process is well known in the prior art. In step 764, either controller 244 or state machine 222 will determine which set of word lines need to be individually controlled for the data access operation and, therefore, should be connected to a separate individually controllable voltage (or other type of) source. In some embodiments, the process of step 764 is based on the programming scheme (including boosting scheme) or the reading scheme (including providing compensation). In step 766, controller 244 or state machine 222 will determine which word lines will not need to be individually controlled for the data access operation and, therefore, can be connected to a common voltage (or other type of) source. For example, step 766 can include determining which word lines can be connected to Vread and/or which word lines can be connected to Vpass. In one embodiment, the determination of whether to connect each word line to either a first common signal source or a individually controllable separate signal source is based on proximity to a selected word line for the data access operation.

In step 768, those word lines that need to be individually controlled will be connected (directly or indirectly) by the bridge circuit (via the CGI lines and decoders) to drivers for separate individually controllable voltage generators (e.g. corresponding to CGA, CGB, CGC) according to the graph of FIG. 13. In step 770, those word lines that can be connected to the common voltage (e.g. CGU), will be connected (directly or indirectly) by the bridge circuit (via CGI lines and decoders) to the appropriate driver in step 770. In one embodiment, all the word lines to be connected to CGU are connected to a single driver. In another embodiment, more than one driver can be used to drive CGU based on power, light impedances, etc. In step 772, the data access operation is performed while the above-described connections continue to persist. If a read operation is being performed, the data being read can be reported to the controller 244 of host 232, as appropriate. Note that in alternate embodiments, the process of step 762-772 can be performed without receiving a request for a data access operation from an external entity. For example, the system may be doing garbage collection, cleanup or other maintenance.

Figure 19:
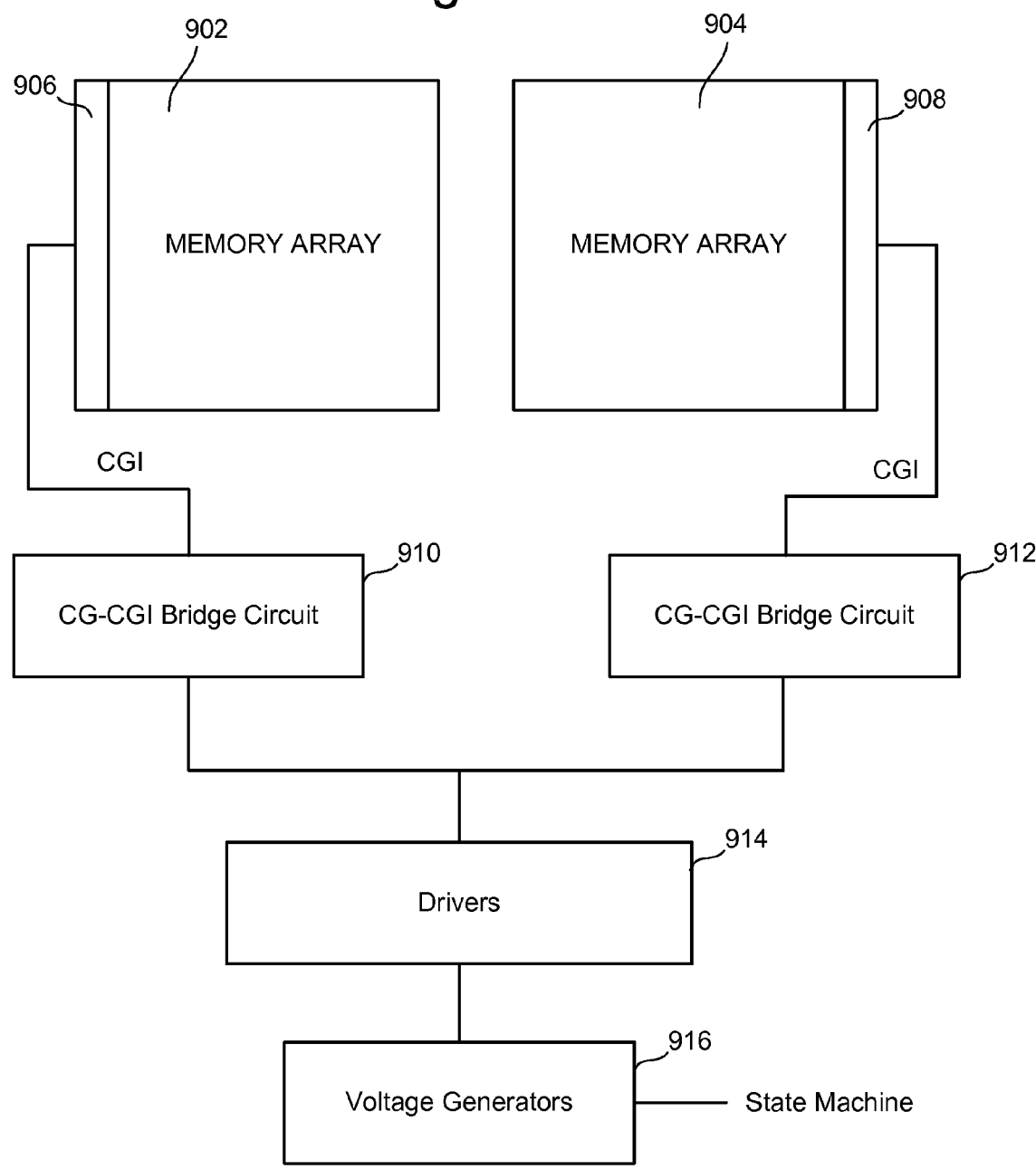
FIG. 19 is a block diagram of a portion of a non-volatile storage system.

FIG. 19 is an alternate embodiment with two memory arrays 902 and 904 on a single chip. Each memory array has its own set of decoders (e.g. decoders 906 and 908), its own set of CGI lines and its own set of word lines (e.g. word lines for array 902 and word lines for array 904). Although FIG. 19 shows decoders on one side of each memory array, in other embodiments there can be decoders on both sides of both memory arrays. FIG. 19 also shows voltage generators 916, drivers 914, bridge circuit 910, and bridge circuit 912. Voltage generators 916 receive a zone address from state machine 222 and send one or more appropriate voltages to drivers 914. Drivers 914 send the individually controllable voltages and the common one or more voltages to bridge circuit 910 and bridge circuit 912. Bridge circuit 910 includes a set of switches, as described above, for providing connections from drivers 914 to the appropriate word lines of memory array 902. Bridge circuit 912 includes switches, as described above, for providing connections from drivers 914 to the appropriate word lines for memory array 904.

Figure 20:
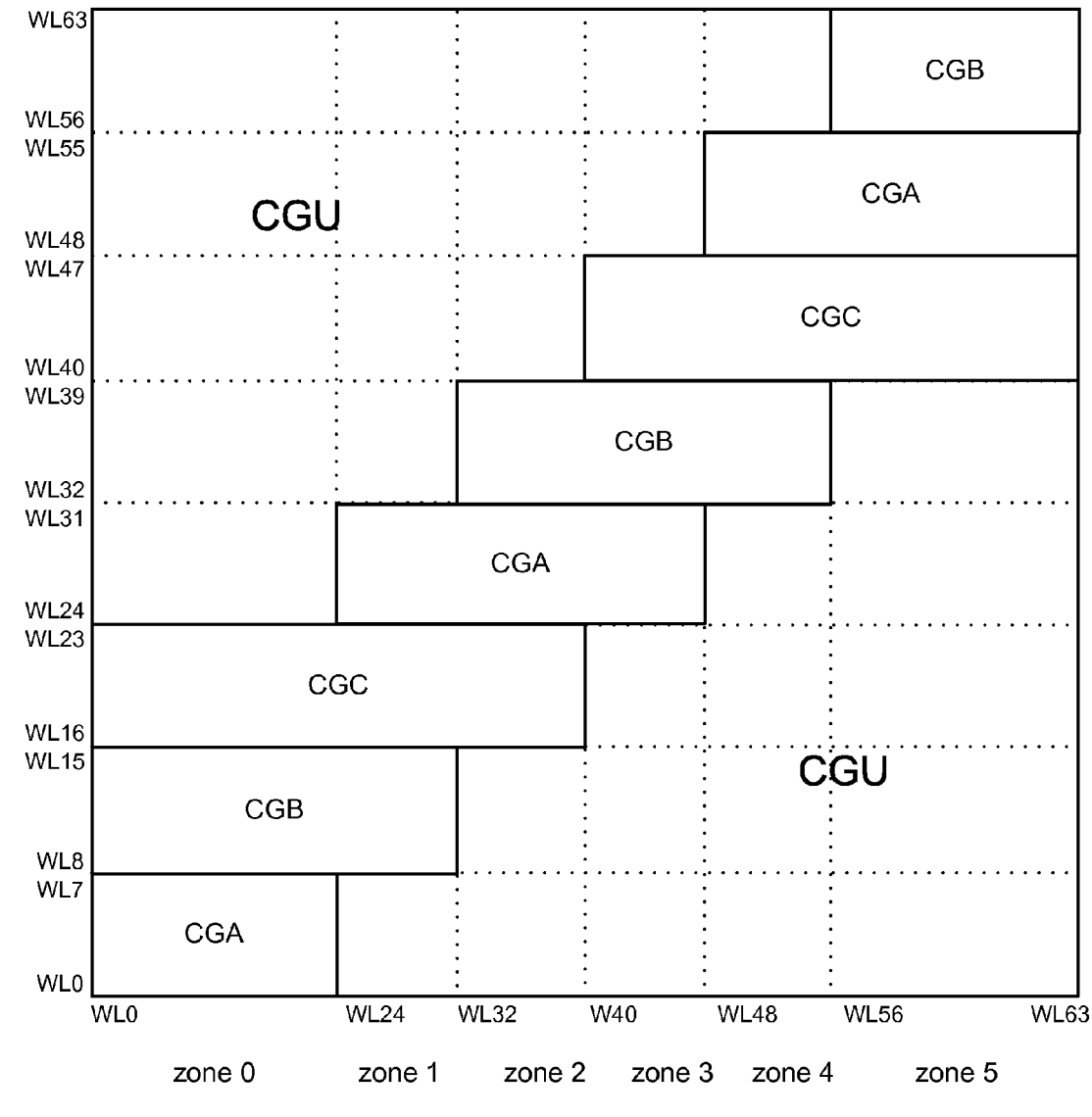
FIG. 20 depicts how word lines can be grouped and selectively connected to individually controllable sources of signal.

FIG. 20 is another example of a graph for assigning word lines to the appropriate drivers based on a selected word line for a memory access operation. FIG. 20 is similar to FIG. 13, however, the borders for each of the zones are different. For example, in FIG. 20 zone 0 is for WL0-WL23, zone 1 is for WL24-WL31, zone 2 is for WL32-WL39, zone 3 is for WL40-WL47, zone 4 is for WL48-WL55, and zone 5 is for WL56-WL63.

Figure 21:
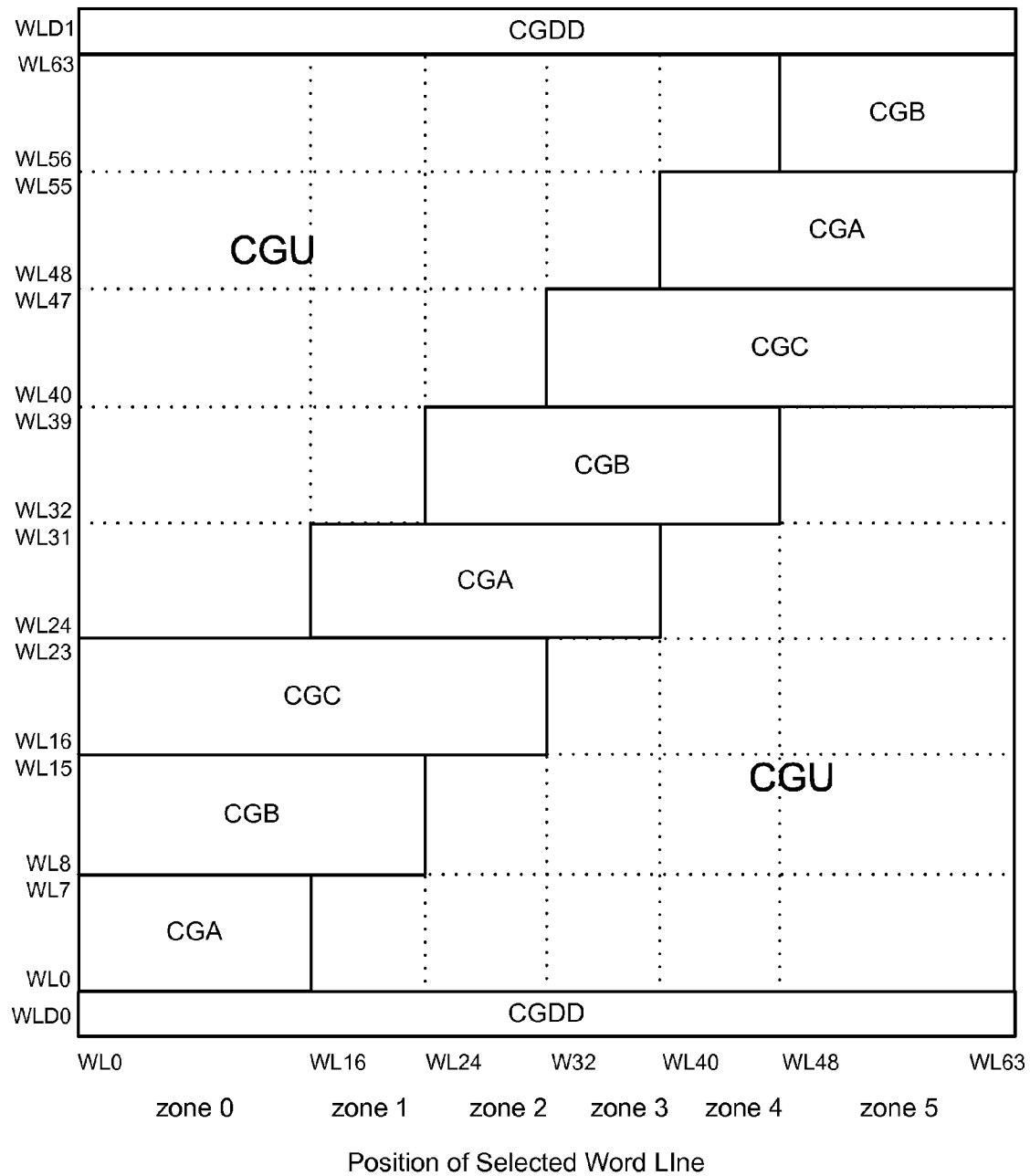
FIG. 21 depicts how word lines can be grouped and selectively connected to individually controllable sources of signal.

FIG. 21 depicts a graph for connecting word lines to drivers for another embodiment. U.S. patent application Ser. No. 11/688,874, "Adjusting Resistance of Nonvolatile Memory Using Dummy Memory Cells," filed on Mar. 21, 2007, provides an example of a non-volatile memory system with dummy memory cells and dummy word lines connected to the dummy memory cells. The graph of FIG. 21 provides connection information for a memory system which includes dummy word lines (WLD0 and WLD1). As can be seen, WLD0 and WLD1 are assigned a permanent connection to two or more drivers that provide voltage CGDD and CGDS, respectively, which are the appropriate voltages for the dummy word lines based on the particular application. Note that in some embodiments, there can be more or less than two dummy word lines. The other assignment for the other word lines are similar to FIG. 13.

Figure 22:
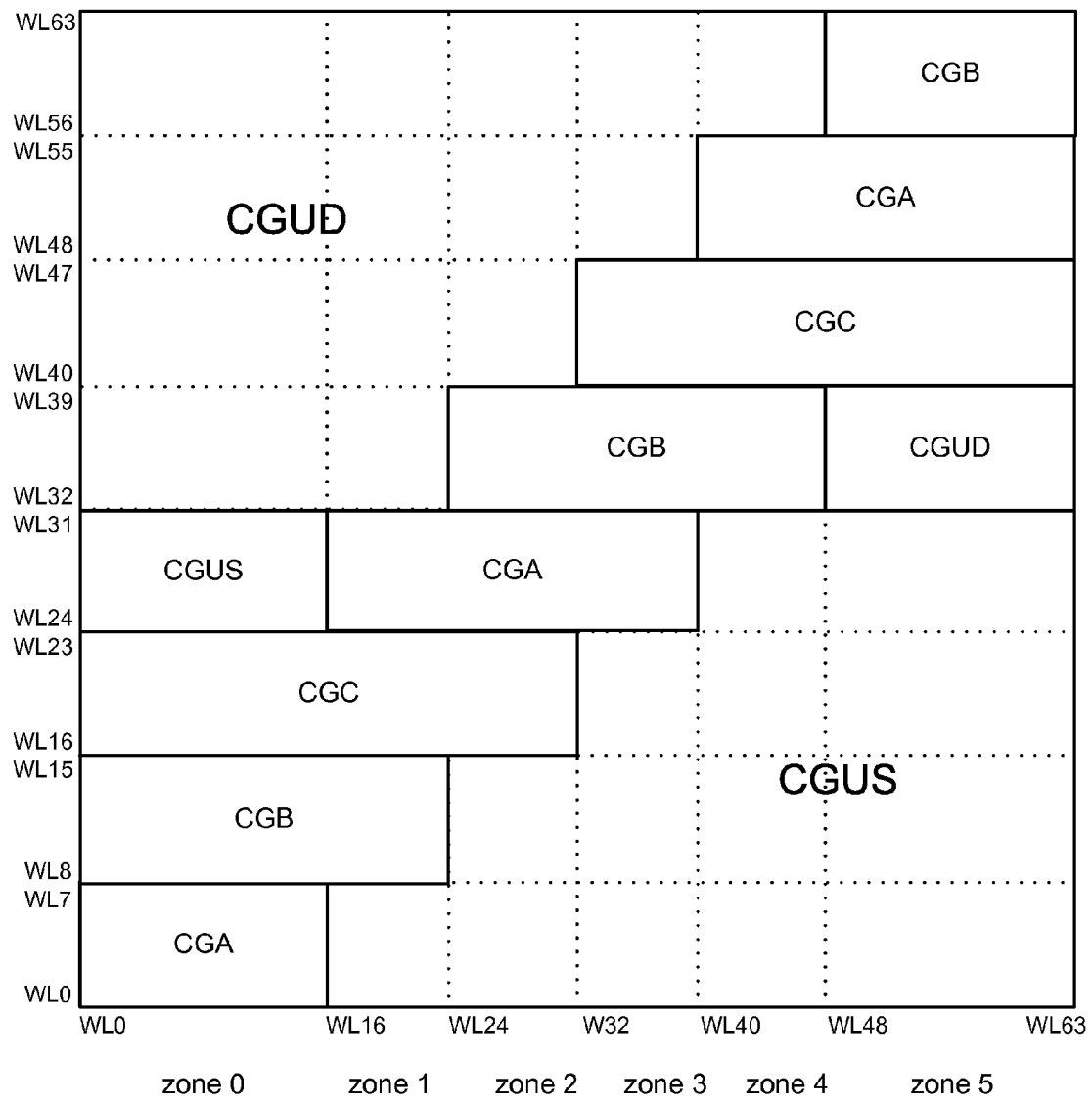
FIG. 22 depicts how word lines can be grouped and selectively connected to individually controllable sources of signal.

FIG. 22 provides a graph of another embodiment which provides for more than one common signal. In one example implementation, those unselected memory cells on the source side are provided one common signal CGUS and those memory cells on the drain side are provided another common signal CGUD. The assignment of CGA, CGB and CGC are the same as FIG. 13. Word lines of WL0-WL31 that are not to receive CGA, CGB or CGC will be assigned to CGUS. Word lines of WL32-WL63 that are not assigned to CGA, CGB or CGC will be assigned to CGUD. This arrangement allows for each switch to still be a 2-to-1 switch. Note that in other embodiments, more than two common signals can be used.

Figure 23:
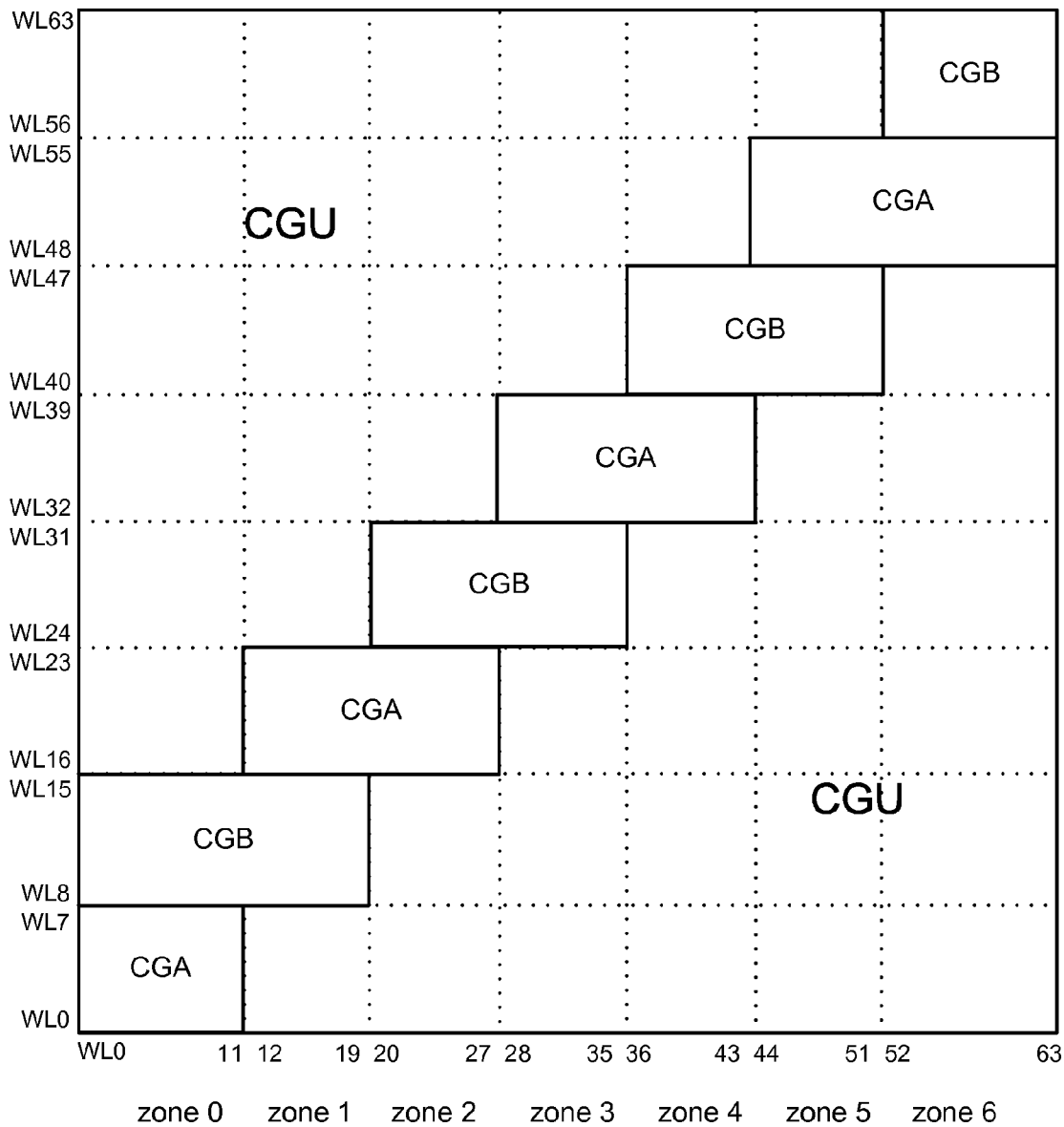
FIG. 23 depicts how word lines can be grouped and selectively connected to individually controllable sources of signal.

FIG. 23 provides a graph of another embodiment which only provides for two groups of individually controllable signals. One of the groups will include the selected word line. In the embodiment of FIG. 23, groups 0, 2, 4 and 6 will select between CGA and CGU, while groups 1, 3, 5 and 7 will select from CGB and CGU. Group 0 includes WL0-WL7. Group 1 includes WL9-WL15. Group 2 includes WL16-WL23. Group 3 includes WL24-WL31. Group 4 includes WL32-WL39. Group 5 includes WL40-WL47. Group 6 includes WL48-WL55. Group 7 includes WL56-WL63. Zone 0 corresponds to WL0-WL11. Zone 1 corresponds to WL12-WL19. Zone 2 corresponds to WL20-WL27. Zone 3 corresponds to WL28-WL35. Zone 4 corresponds to WL36-WL43. Zone 5 corresponds to WL44-WL51. Zone 6 corresponds to WL52-WL63. For example, if the selected word line is in zone 3, then CGB is connected to WL24-WL31, CGA is connected to WL32-39 and CGU is connected to the other word lines.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage apparatus, comprising:
a first plurality of non-volatile storage elements;
a first set of control lines in communication with said first set of non-volatile storage elements;
a first source of signal;
a set of individually controlled sources of signal;
a first bridge circuit in communication with said first set of control lines, said set of individually controlled sources of signal and said first source of signal, said first bridge circuit individually and selectively connects each of said first set of control lines to either said first source of signal or one of said set of individually controlled sources of signal; and
a control circuit in communication with said first bridge circuit.

2. A non-volatile storage apparatus according to claim 1, wherein:
said first set of control lines are word lines;
said set of individually controlled sources of signal includes a set of drivers in communication with voltage generators; and
said control circuit controls said individually controlled sources of signal to provide appropriate voltages for read and program operations.

3. A non-volatile storage apparatus according to claim 2, wherein:
said first bridge circuit includes a plurality of switches the selectively connect each word line to either said first source of signal or an appropriate one of said drivers.

4. A non-volatile storage apparatus according to claim 1, wherein:
said first set of control lines are word lines;
said word lines are divided into groups of neighboring word lines; and
said first bridge circuit connects a first group of neighboring word lines to a first subset of said individually controlled sources of signal, said first group of neighboring word lines includes a selected word line for a data access operation, said first bridge circuit connects additional groups of neighboring word lines that are adjacent said first group to other subsets of said individually controlled sources of signal.

5. A non-volatile storage apparatus according to claim 1, wherein:
said first bridge circuit connects each control line of said first set of control lines to either said first source of signal or one of said individually controlled sources of signal based on proximity to a selected control line for a data access operation; and said control circuit performs said data access operation while each control line of said first set of control lines is connected to said first source of signal or one of said individually controlled sources of signal based on proximity to said selected control line for said data access operation.

6. A non-volatile storage apparatus according to claim 1, wherein:
   said first set of control lines are word lines;
   said word lines are divided into groups of neighboring word lines; and
   said first bridge circuit connects a first group of neighboring word lines to a first subset of said individually controlled sources of signal, said first group of neighboring word lines includes a selected word line for a data access operation, said first bridge circuit connects an additional group of neighboring word lines that is adjacent to said first group to a second subset of said individually controlled sources of signal.

7. A non-volatile storage apparatus according to claim 1, wherein:
   said first set of control lines include data word lines and dummy word lines;
   said set of individually controlled sources of signal includes a set of drivers in communication with voltage generators;
   said voltage generators includes one or more voltage generators for said dummy word lines; and
   said bridge circuit connects said dummy word lines to said one or more voltage generators for said dummy word lines.

8. A non-volatile storage apparatus according to claim 1, further comprising:
   a second plurality of non-volatile storage elements;
   a second set of control lines in communication with said second set of non-volatile storage elements; and
   a second bridge circuit in communication with said second set of control lines, said set of individually controlled sources of signal and said first source of signal, said second bridge circuit individually and selectively connects each of said second set of control lines to either said first source of signal or one of said set of individually controlled sources of signal.

9. A non-volatile storage apparatus according to claim 1, further comprising:
   a second plurality of non-volatile storage elements;
   a second set of control lines in communication with said second set of non-volatile storage elements; and
   a second source of signal, said first bridge circuit individually and selectively connects each of said second set of control lines to either said second source of signal or one of said set of individually controlled sources of signal.

10. A non-volatile storage apparatus according to claim 1, wherein:
    said control circuit provides information to said first bridge circuit that indicates which of said first set of control lines should be connected to said first source of signal and which of said first set of control lines should be connected to said set of individually controlled sources of signal.

11. A non-volatile storage apparatus according to claim 10, wherein:
    said first set of control lines are word lines; and
    said first bridge circuit individually and selectively connects each of said word lines to either said first source of signal or one of said set of individually controlled sources of signal via signal lines and decoders between said word lines and said bridge circuit.

12. A non-volatile storage apparatus according to claim 1, wherein:
    said first plurality of non-volatile storage elements are flash memory devices.

13. A non-volatile storage apparatus according to claim 1, wherein:
    said first plurality of non-volatile storage elements are NAND flash memory devices.

14. A non-volatile storage apparatus, comprising:
    a first plurality of non-volatile storage elements;
    a first set of control lines in communication with said first plurality of non-volatile storage elements;
    a common signal source;
    a set of individually controlled sources of signal;
    a managing circuit in communication with said set of control lines, said managing circuit connects each control line of said first set of control lines to either said common signal source or one of said individually controlled sources of signal based on proximity to a selected control line for a data access operation, said managing circuit performs said data access operation while each control line of said first set is connected to said common signal source or said separate signal source based on proximity to said selected control line for said data access operation.

15. A non-volatile storage apparatus according to claim 14, wherein:
    said first plurality of non-volatile storage elements are NAND flash memory devices;
    said first set of control lines are word lines;
    said set of individually controlled sources of signal includes a set of drivers in communication with voltage generators; and
    said managing circuit controls said individually controlled sources of signal to provide appropriate voltages for read and program operations.

16. A non-volatile storage apparatus according to claim 14, wherein:
    said first set of control lines are word lines; and
    said managing circuit includes a plurality of switches that selectively connect each word line to either said common signal source or an appropriate one of said individually controlled sources of signal.

17. A non-volatile storage apparatus according to claim 14, wherein:
    said first set of control lines are word lines;
    said word lines are divided into groups of neighboring word lines; and
    said managing circuit connects a first group of neighboring word lines to a first subset of said individually controlled sources of signal, said first group of neighboring word lines includes a selected word line for said data access operation, said managing circuit connects an additional group of neighboring word lines that is adjacent to said first group to a second subset of said individually controlled sources of signal.

18. A non-volatile storage apparatus according to claim 14, further comprising:
    a second plurality of non-volatile storage elements;
    a second set of control lines in communication with said second set of non-volatile storage elements, said managing circuit includes a first bridge circuit and a second bridge circuit, said first bridge circuit connects each control line of said first set of control lines to either said common signal source or one of said individually controlled sources of signal based on proximity to said selected control line for said data access operation, said second bridge circuit connects each control line of said second set of control lines to either said common signal source or one of said individually controlled sources of signal based on proximity to a different selected control line.

19. A non-volatile storage apparatus, comprising:
a plurality of NAND flash memory devices;
a first set of word lines in communication with at least a first subset of said flash memory devices;
means for connecting each word line of said first set of word lines to either a common signal source or a separate signal source based on proximity to a first selected word line for a data access operation; and
means for performing said data access operation while each word line of said first set is connected to said common signal source or said separate signal source based on proximity to said selected word line for said data access operation.

20. A non-volatile storage apparatus according to claim 19, further comprising:
a second set of word lines in communication with a second subset of said flash memory devices; and
means for connecting each word line of said second set of word lines to either said common signal source or a separate signal source based on proximity to a second selected word line.

21. A method of operating non-volatile storage, comprising:
connecting each control line of a first set of control lines to either a first common signal source or a separate signal source of a plurality of separate signal sources based on proximity to a selected control line for a data access operation, said first set of control lines are in communication with said non-volatile storage; and
performing said data access operation while each control line of said first set of control lines is connected to said first common signal source or said separate signal source based on proximity to said selected control line for said data access operation.

22. A method according to claim 21, wherein:
said first set of control lines is a set of word lines;
said set of word lines is divided into groups of neighboring word lines;
said method includes identifying word lines in a first group of neighboring word lines that includes said selected control line and identifying word lines in a second group of neighboring word lines that is adjacent to said first group; and
said connecting each control line includes connecting word lines in said first group and said second group to separate signal sources.

23. A method according to claim 21, further comprising:
determining a selected word line for said data access operation, said first set of control lines is a set of word lines;
determining a first subset of said word lines to be individually controlled for said data access operation based on proximity to said selected word line; and
determining a second subset of word lines that will not be individually controlled for said data access operation based on proximity to said selected word line, said connecting includes connecting said first subset of word lines to separate signal sources and connecting said second subset of word lines to said common signal source.

24. A method according to claim 23, wherein:
said set of word lines are divided into groups of neighboring word lines; and
said determining a first subset of said word lines includes identifying word lines in a first group of neighboring word lines that includes said selected word line and identifying word lines in additional groups of neighboring word lines that are adjacent to said first group.

25. A method according to claim 23, wherein:
said set of word lines are divided into groups of neighboring word lines; and
said determining a first subset of said word lines includes identifying word lines in a first group of neighboring word lines that includes said selected word line and identifying word lines in a second group of neighboring word lines that is adjacent to said first group.

26. A method according to claim 23, wherein:
said data access operation is a read operation;
said common signal source provides a voltage to turn on unselected non-volatile storage elements; and
said separate signal sources provide a read compare voltage, one or more compensation voltages, and said voltage to turn on unselected non-volatile storage elements.

27. A method according to claim 23, wherein:
said data access operation is a programming operation;
said common signal source provides a pass voltage; and
said separate signal sources provide a program voltage, isolation voltages, intermediate voltages and said pass voltage.

28. A method according to claim 21, further comprising:
providing a different voltage to dummy word lines, said common signal source and said separate signal sources are voltage sources.

29. A method according to claim 21, further comprising:
connecting each control line of a second set of control lines to either a second common signal source or one of said plurality of separate signal sources based on proximity to said selected control line for said data access operation, said data access operation is performed while each control line of said second set is connected to said second common signal source or one of said plurality of separate signal sources based on proximity to said selected control line for said data access operation.

30. A method according to claim 21, wherein:
said set of control lines are word lines.

31. A method according to claim 21, wherein:
said non-volatile storage is flash memory.

32. A method according to claim 21, wherein:
said first set of control lines is a set of word lines;
said connecting each control line of a first set of control lines includes connecting said word lines to either said first common signal source or a separate signal source of said plurality of separate signals sources via decoders, signal lines, and a bridge circuit.

33. A method of operating non-volatile storage, comprising:
receiving a request for a data access operation;
determining a selected word line;
determining a first set of word lines to be individually controlled for said data access operation;
determining a second set of word lines that will not be individually controlled for said data access operation; and
performing said data access operation including individually controlling said first set of word lines and providing a common signal to said second set of word lines.

34. A method according to claim 33, wherein:
said word lines are divided into groups of neighboring word lines; and
said determining a first set of said word lines includes identifying word lines in a first group of neighboring word lines that includes said selected word line and identifying word lines in additional groups of neighboring word lines that are adjacent to said first group of neighboring word lines.

35. A method according to claim 33, wherein:
said set of word lines are divided into groups of neighboring word lines; and
said determining a first set of said word lines includes identifying word lines in a first group of neighboring word lines that includes said selected word line and identifying word lines in a second group of neighboring word lines that is adjacent to said first group.

36. A method according to claim 33, wherein:
said data access operation is a read operation; and
said performing said data access operation includes reporting data read.

37. A method according to claim 33, wherein:
said data access operation is a programming operation that includes receiving data and writing said data to semiconductor non-volatile storage.

38. A method of operating non-volatile storage, comprising:
receiving a request for a data access operation;
determining a selected word line;
determining a first set of word lines to be individually controlled for said data access operation;
determining a second set of word lines that will not be individually controlled for said data access operation;
connecting each of said first set of word lines to separately controllable voltage signals;
connecting each of said second set of word lines to a single voltage source; and
performing said data access operation while said first set of word lines are connected to separately controllable voltage signals and said second set of word lines are connected to said single voltage source.

39. A method according to claim 38, wherein:
said word lines are divided into groups of neighboring word lines; and
said determining a first set of said word lines includes identifying word lines in a first group of neighboring word lines that includes said selected word line and identifying word lines in additional groups of neighboring word lines that are adjacent to said first group of neighboring word lines.

40. A method according to claim 39, wherein:
said connecting each of said second set of word lines to a single signal source includes connecting all word lines of said second set of word lines to a single driver; and
said connecting each of said first set of word lines to separately controllable signals includes connecting all word lines of said second set of word lines to separate drivers.

41. A method according to claim 38, wherein:
said word lines are divided into groups of neighboring word lines; and
said determining a first set of said word lines includes identifying word lines in a first group of neighboring word lines that includes said selected word line and identifying word lines in a second group of neighboring word lines that is adjacent to said first group.

* * * * *